United States Patent
Taylor

(10) Patent No.: US 7,262,429 B2
(45) Date of Patent: Aug. 28, 2007

(54) THZ DETECTION EMPLOYING MODULATION DOPED QUANTUM WELL DEVICE STRUCTURES

(76) Inventor: Geoff W. Taylor, 22 Quail Run, Storrs-Mansfield, CT (US) 06268

( * ) Notice: Subject to any disclaimer, the term of this patent is extended or adjusted under 35 U.S.C. 154(b) by 170 days.

(21) Appl. No.: 10/512,501

(22) PCT Filed: Apr. 28, 2003

(86) PCT No.: PCT/US03/13183

§ 371 (c)(1),
(2), (4) Date: Apr. 27, 2005

(87) PCT Pub. No.: WO03/092047

PCT Pub. Date: Nov. 6, 2003

(65) Prior Publication Data

US 2005/0230705 A1    Oct. 20, 2005

(51) Int. Cl.
*H01L 26/06*    (2006.01)

(52) U.S. Cl. .................... 257/21; 257/14; 257/15; 257/E29.072; 257/E33.008; 438/48

(58) Field of Classification Search ............... None
See application file for complete search history.

(56) References Cited

U.S. PATENT DOCUMENTS

| | | | |
|---|---|---|---|
| 5,268,315 A | 12/1993 | Prasad et al. | 437/31 |
| 5,385,865 A | 1/1995 | Nieder et al. | 437/133 |
| 5,401,953 A | 3/1995 | Spencer et al. | 250/208.4 |
| 5,821,825 A | 10/1998 | Kobayashi | 331/66 |
| 5,914,497 A * | 6/1999 | Sherwin | 257/21 |

2005/0230705 A1 * 10/2005 Taylor ................. 257/120

FOREIGN PATENT DOCUMENTS

EP        0 606 776 A2    12/1993

OTHER PUBLICATIONS

"Resonant Tunneling through Quantum Wells at Frequencies up to 2.5 Thz"; T.C.L.G. Sollner, W.D. Goodhue. P.E. Tannenwald, C.D. Parker and D.D. Peck, Jul. 1983.

* cited by examiner

*Primary Examiner*—Evan Pert
*Assistant Examiner*—Scott R. Wilson
(74) *Attorney, Agent, or Firm*—Gordon & Jacobson, PC

(57)    ABSTRACT

An improved THz detection mechanism includes a heterojunction thyristor structure logically formed by an n-type quantum-well-base bipolar transistor and p-type quantum-wellbase bipolar transistor arranged vertically to share a common collector region. Antenna elements, which are adapted to receive electromagnetic radiation in a desired portion of the THz region, are electrically coupled (or integrally formed with) the p-channel injector electrodes of the heterojunction thyristor device such the that antenna elements are electrically connected to the p-type modulation doped quantum well interface of the device. THz radiation supplied by the antenna elements to the p-type quantum well interface increases electron temperature of a two-dimensional electron gas at the p-type modulation doped quantum well interface thereby producing a current resulting from thermionic emission over a potential barrier provided by said first-type modulation doped quantum well interface. This current flows over the p-type channel barrier to the ntype quantum well interface, thereby causing charge to accumulate in the n-type quantum well interface. The accumulated charge in the n-type quantum well interface is related to the intensity of the received THz radiation. The heterojunction-thyristor-based THz detector is suitable for many applications, including data communication applications and imaging applications.

27 Claims, 16 Drawing Sheets

| LAYER MATERIAL | LAYER DOPING TYPE | TYPICAL DOPING CONCENTRATION (atoms/cm$^{-3}$) | TYPICAL LAYER THICKNESS (Å) | LAYER # |
|---|---|---|---|---|
| InGaAs | P+ | 1E20 | 25 | 1165b |
| GaAs | P+ | 1E20 | 75 | 1165a |
| Al(.7)Ga(.3)As | P | 1E17 | 700 | 1164b |
| Al(.7)Ga(.3)As | P+ | 1E19 | 10 | 1164a |
| Al(.15)Ga(.85)As | P+ | 3.5E18 | 25 | 1163d |
| Al(.15)Ga(.85)As | UD | | 300 | 1163c |
| Al(.15)Ga(.85)As | N+ | 3.5E18 | 80 | 1163b |
| Al(.15)Ga(.85)As | UD | | 30 | 1163a |
| GaAs | UD | | 15 | 1162 |
| In(.20)Ga(.80)AsN QW/GaAs QW ×3 | UD | | 60 | 1161 |
| GaAs BARRIER | UD | | 100 | 1160b |
| GaAs | UD | | 150 | 1160a |
| Al(.15)Ga(.85)AsN | UD | | 5000 | 1159 |
| GaAs BARRIER | UD | | 100 | 1158 |
| In(.20)Ga(.80)AsN QW/GaAs QW ×3 | UD | | 60 | 1157 |
| GaAs | UD | | 15 | 1156 |
| Al(.15)Ga(.85)As | UD | | 30 | 1155d |
| Al(.15)Ga(.85)As | P+ | 3.5E18 | 80 | 1155c |
| Al(.15)Ga(.85)As | UD | | 300 | 1155b |
| Al(.15)Ga(.85)As | N | 3.5E18 | 80 | 1155a |
| Al(.7)Ga(.3)As | N | 1E17 | 700 | 1154 |
| GaAs | N+ | 3.5E18 | 2200 | 1153 |
| GaAs SUBSTRATE | SI | | | 1149 |

FIG.5

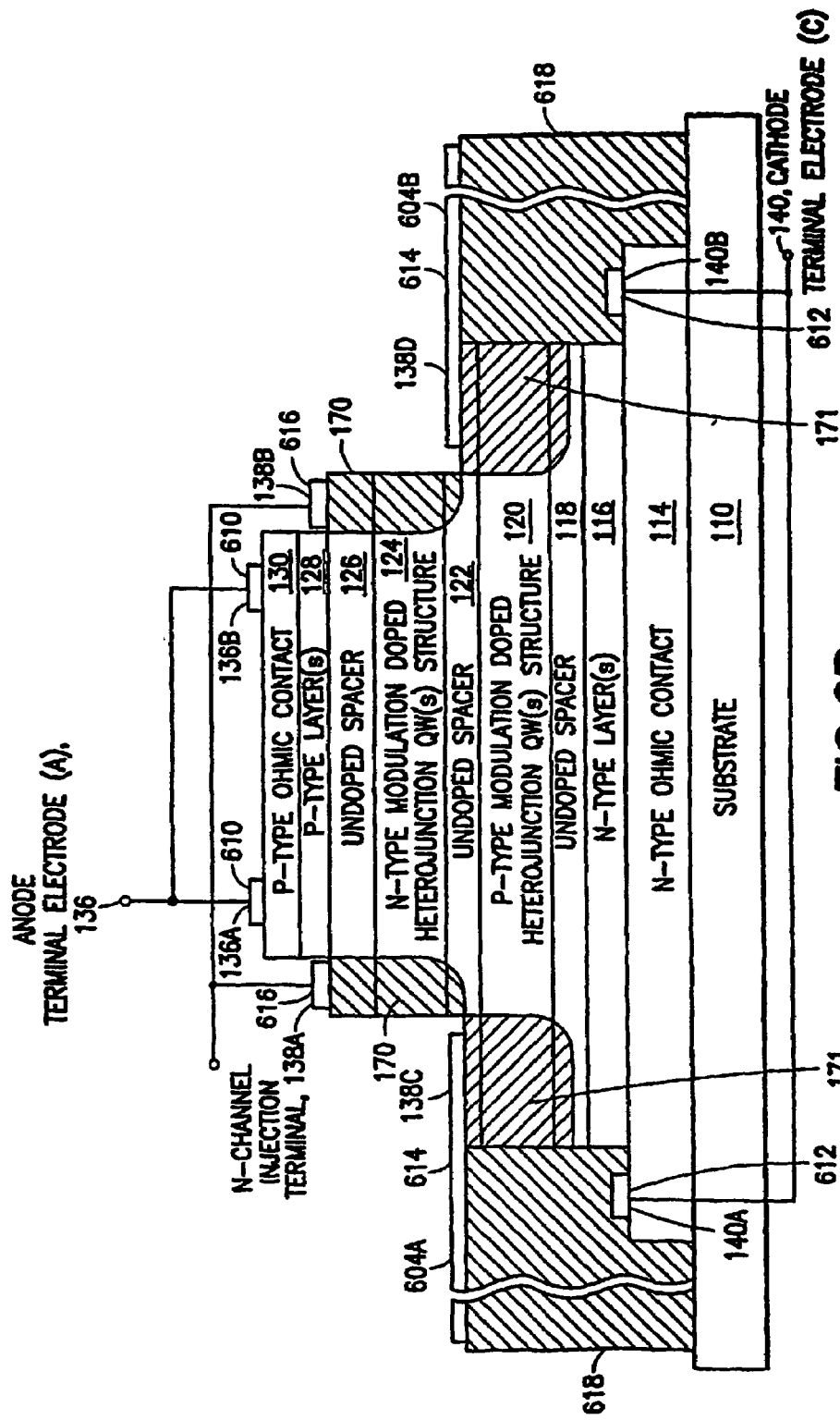

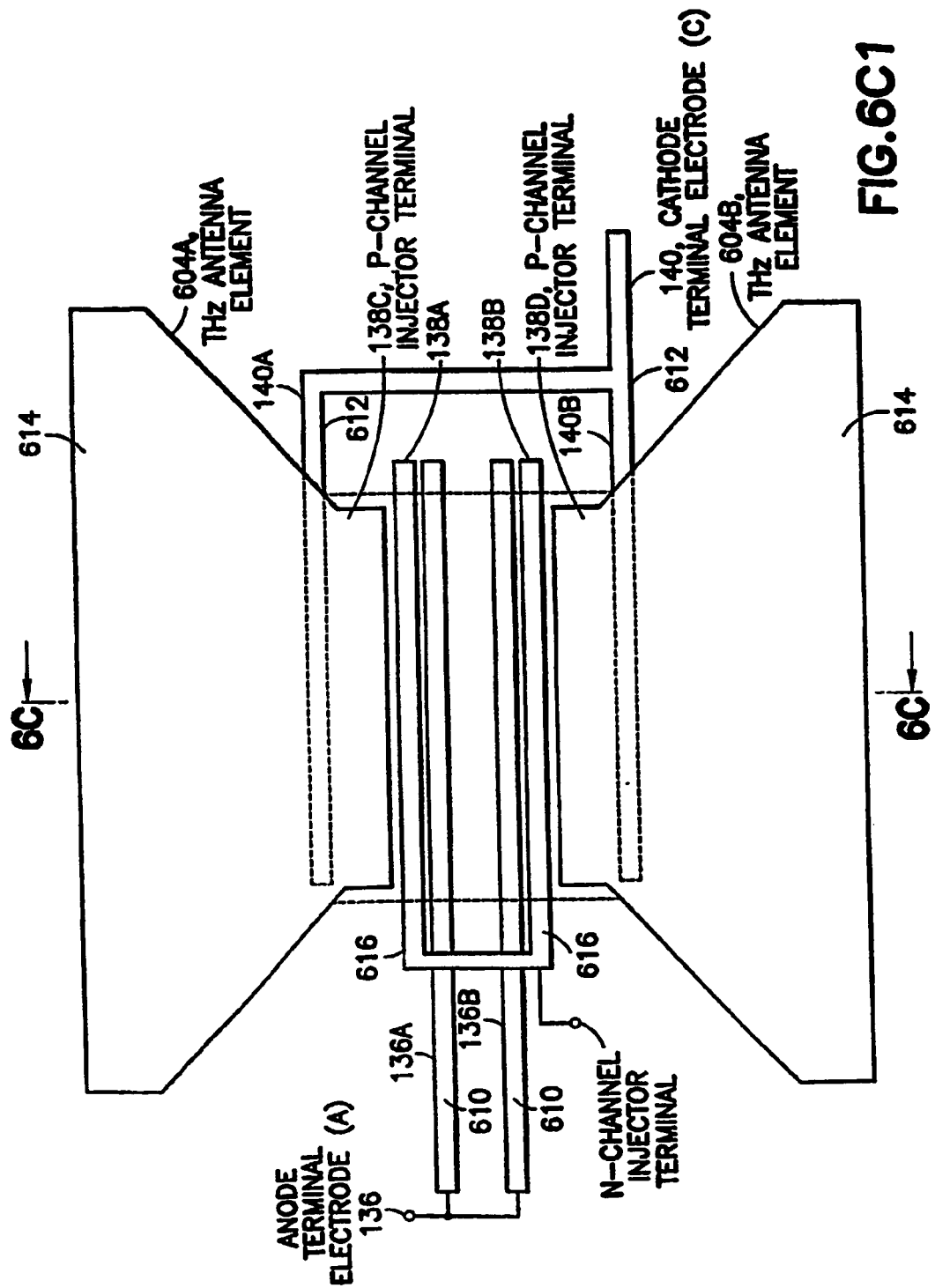

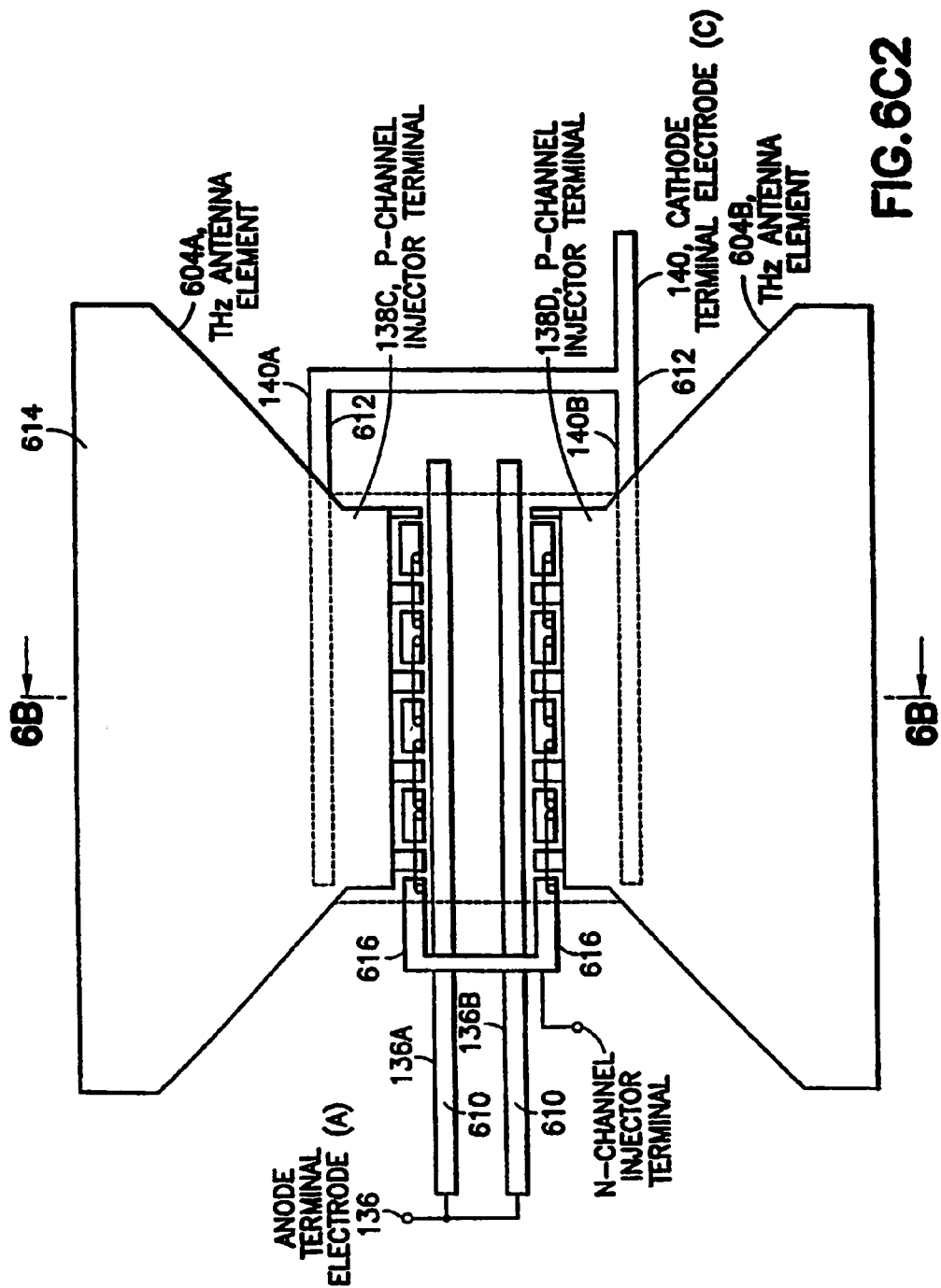

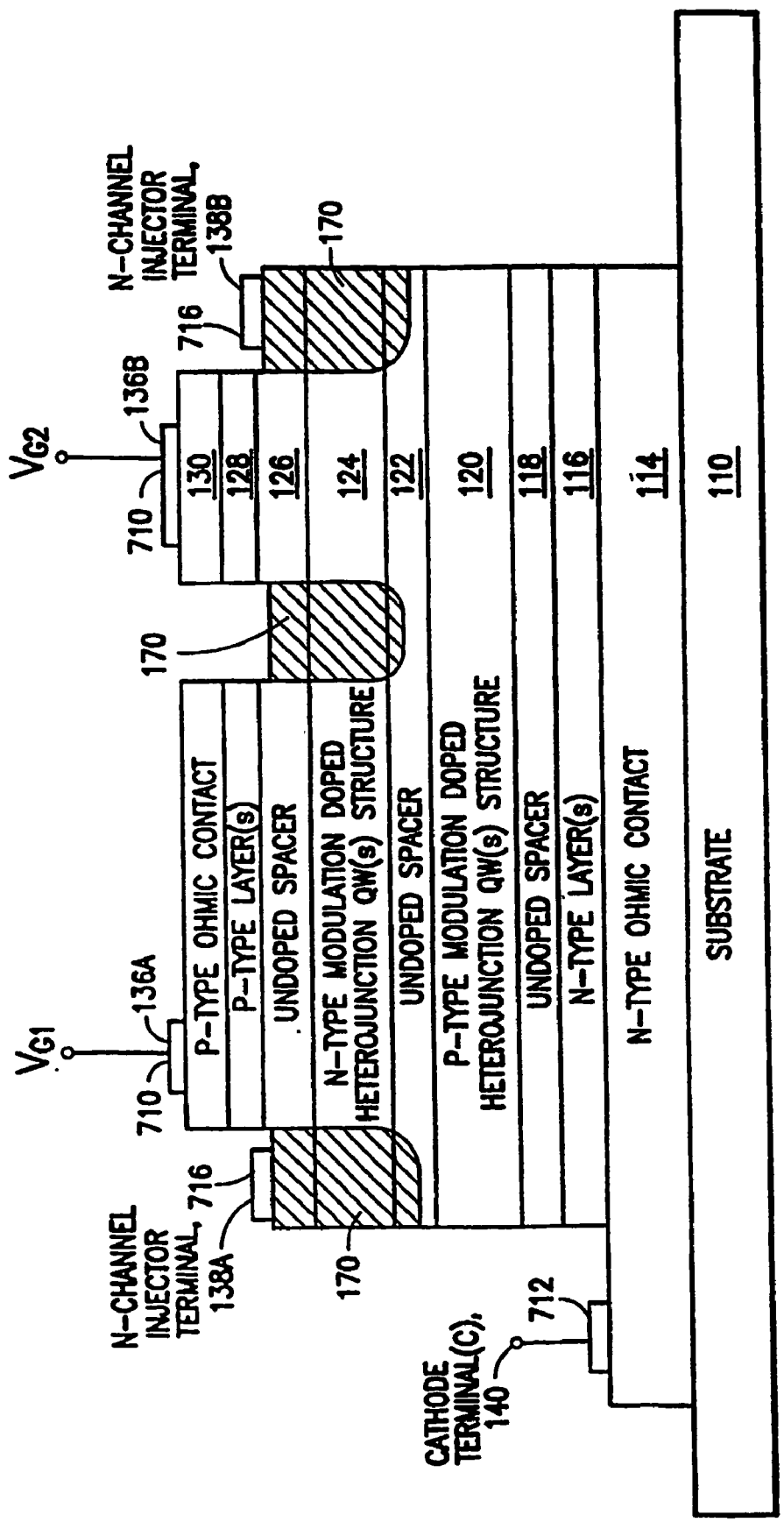
FIG.7C1

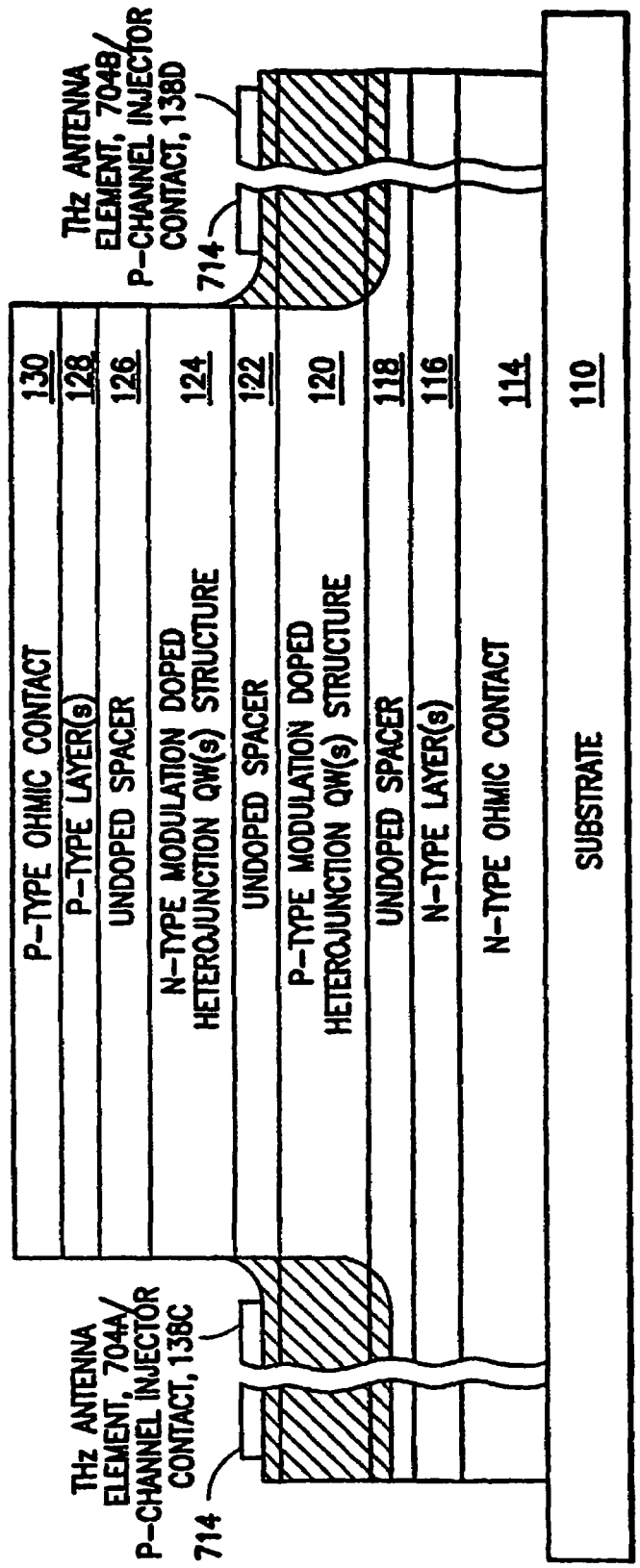
FIG. 7C2

THZ DETECTION EMPLOYING MODULATION DOPED QUANTUM WELL DEVICE STRUCTURES

BACKGROUND OF THE INVENTION

1. Field of the Invention

This invention relates broadly to semiconductor device structures. More particularly, this invention relates to semiconductor devices made with modulation doped quantum well interfaces that operate to detect high frequency electromagnetic radiation.

2. State of the Art

Satellite communication systems are now pushing into the sub-millimeter wave region in the quest for greater data throughput. With the upcoming wireless revolution and the anticipated demand for Internet services from almost anywhere, there will be significant demand for higher frequency carriers and modulation capability commensurate with these bandwidths. For future military terrestrial communication channels, the THz region (100 GHz-10,000 GHz) offers greatly enhanced capability. For satellite/ground and helicopter/ground links it avoids many of the problems of atmospheric scattering and absorption and adverse climatic conditions found in bandwidths up to 300 GHz. In addition, large toxic molecules of biological and chemical agents have resonances in the THz region and the detection of certain (chemical) weapons and explosives would be enabled. Furthermore, standoff detection (which involves passive and active methods for sensing of chemical and biological material when the sensor is physically separated from the site of interest) could be achieved by monolithic integration of a detector of electromagnetic radiation in the THz region (100 GHz-10,000 GHz), referred to herein as a THz detector, with data processing circuits providing a rugged, compact and portable sensor offering critical human protection.

State-of-the-art FET devices, such as High Electron Mobility Transistors (HEMTs), have conventional electronic cutoff frequencies in the 150-200 GHz range for channel lengths of 0.1 mm. Several reports discuss the possibility of using plasma resonance of the two-dimensional electron gas (referred to herein as "2D gas") at the modulation doped interface in a HEMT to implement a THz detector. See i) W. Knap et al., "Resonant Detection of Subterahertz Radiation by Plasma Waves in a Submicron Field-Effect Transistor," Applied Phys. Letts., Vol. 80, No. 18, May 6, 2002, pg. 3433-3436; ii) M. I. Dyakonov et al., "Plasma Wave Electronics: Novel Terahertz Devices using Two Dimensional Electron Fluid," IEEE Trans. Elec. Dev., Vol. 43, No. 10, October 1996, pg. 1640-1645; and iii) M. Shur et al. "Terahertz Sources and Detectors Using 2D Electronic Fluid," IEEE Transactions on Microwave Theory and Techniques, Vol. 48, No. 4, April 2000, pg. 750. However, the mean free paths necessary for plasma resonances requires sub-0.1 µm transistor structures or cryogenic cooling to below 77 K. Such small transistor structures and cryogenic cooling substantially increases the manufacturing cost of the THz detector. Furthermore, there is no input/output isolation in the HEMT configuration since the channel must absorb the radiation as well as interface to another electronic device.

Other reports have suggested additional mechanisms by which the 2D gas at a modulation doped interface may function as a THz detector. In Barbieri et al., Hot-electron Multiquantum Well Microwave Detector Operating at Room Temperature," Appl. Phys. Lett., Vol. 23, No. 2, 1995, pp 250-253 and Barbieri et al., "Broadband Microwave Detection with a Novel 2D Hot-Electron Device," Superlattices and Microstructures, Vol. 23, No. 5, 1998, pp. 1079, a structure similar to a Quantum Well Infrared Photodetector (QWIP) device is used to generate a photocurrent due to incident electromagnetic radiation in the THz region. The mechanism of response is the thermionic emission of electrons from the confined state to the continuum due to electron heating of the 2D gas, i.e. the 2D gas was heated preferentially to the lattice. In K. S. Yngvesson, "Ultrafast two-dimensional electron gas detector and mixer for terahertz radiation," Appl. Phys. Lett., Vol. 76, No. 6, February 2000, pp 777, thermionic emission of electrons from the confined state to the continuum due to electron heating of the 2D gas in a HEMT structure is used to produce a detector and mixer for THz radiation. The problem in utilizing such QWIP and HEMT device structures is that of extracting a useable signal from the device. More specifically, when the 2D gas is heated by an antenna connected thereto, there is no place for photocurrent to flow. In other words, there is no way to efficiently remove photocurrent from the device.

SUMMARY OF THE INVENTION

It is therefore an object of the invention to provide a THz detector that includes a modulation doped quantum well interface and that makes effective use of the electron heating (e.g., thermionic properties) at the modulation doped quantum well interface for the sensing of electromagnetic radiation in the THz region (100 GHz-10,000 GHz).

It is another object of the invention to provide such a THz detector that provides an output signal that is isolated from the modulation quantum well interface that provides the sensing of the THz electromagnetic radiation.

It is a further object of the invention to provide such a THZ detector that does not require cryogenic cooling for effective operations.

It is another object of the invention to provide such a THz detector that is suitable for use in THz data communication applications.

It is another object of the invention to provide such a THz detector that is suitable for use in imaging applications.

It is a further object of the invention to provide a THZ detector whose device structures and associated circuit elements can be monolithically integrated onto a common substrate.

In accord with these objects, which will be discussed in detail below, an improved THz detection mechanism is provided. The THz detection mechanism includes a heterojunction thyristor structure logically formed by an n-type quantum-well-base bipolar transistor and p-type quantum-well-base bipolar transistor arranged vertically to share a common collector region. Antenna elements, which are adapted to receive electromagnetic radiation in a desired portion of the THz region, are electrically coupled (or integrally formed with) the p-channel injector electrodes of the heterojunction thyristor device such the that antenna elements are electrically connected to the p-type modulation doped quantum well interface of the device. THz radiation supplied by the antenna elements to the p-type quantum well interface will be absorbed thereby increasing the electron temperature of a two-dimensional electron gas at the p-type modulation doped quantum well interface. This causes the p-type modulation doped quantum well interface to be emptied, thereby accumulating a charge in the p-type modu lation doped layer and producing a forward bias on the p-type QW channel barrier, which results in a current flow. This current results from thermionic emission over a potential barrier provided by the p-type modulation doped quantum well interface and flows over the p-type channel barrier to the n-type quantum well interface, thereby causing charge to accumulate in the n-type quantum well interface. The accumulated charge in the n-type quantum well interface is related to the intensity of the received THz radiation.

It will be appreciated that the operation of the heterojunction-thyristor-based THz detector is suitable for many applications, including data communication applications and imaging applications.

According to another aspect of the present invention, the improved THz detection mechanism includes a quantum-well-base bipolar transistor having an emitter terminal, collector terminal, and at least one base terminal coupled to a modulation doped quantum well interface. Antenna elements, which are adapted to receive electromagnetic radiation in a desired portion of the THz region, are electrically coupled to (or integrally formed with) the base terminal of the quantum-well-base bipolar transistor such the that antenna elements are electrically connected to the modulation doped quantum well interface of the device. THz radiation supplied by the antenna elements to the quantum well interface will be absorbed thereby increasing the electron temperature of a two-dimensional electron gas at the p-type modulation doped quantum well interface. This causes the p-type modulation doped quantum well interface to be emptied, thereby accumulating a charge in the modulation doped layer and producing a forward bias on the quantum well channel barrier, which results in a current flow. This current results from thermionic emission over a potential barrier provided by the modulation doped quantum well interface, and is output via the collector terminal of the bipolar transistor device. This output current is related to the power of the received THz electromagnetic radiation.

Additional objects and advantages of the invention will become apparent to those skilled in the art upon reference to the detailed description taken in conjunction with the provided figures.

BRIEF DESCRIPTION OF THE DRAWINGS

FIG. 5 is a schematic showing an alternate layer structure made with group III-V material from which the heterojunction thyristor devices and THz detection mechanisms of the present invention can be made.

FIG. 6B is a schematic view showing an exemplary realization of the thyristor device and antenna elements of FIG. 6A utilizing the multi-layer structure of FIG. 4.

FIGS. 6C1 and 6C2 are schematic plan views showing two exemplary realizations of the thyristor device and antenna elements of FIG. 6A.

FIGS. 7C1 and 7C2 are schematic views showing the exemplary realization of the thyristor device and antenna elements of FIG. 7B utilizing the multi-layer structure of FIG. 4.

DETAILED DESCRIPTION OF THE PREFERRED EMBODIMENT

Figure 1:
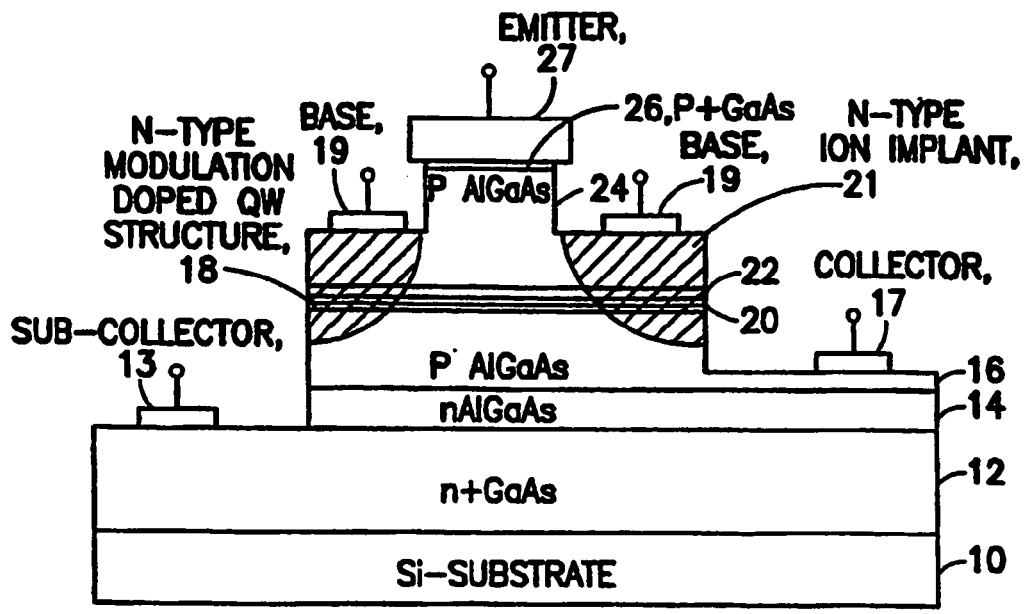
FIG. 1 is a schematic view showing an exemplary quantum-well base bipolar transistor device.

In accordance with the present invention, an electronic device is provided that includes a modulation doped quantum well interface. Antenna elements, which are adapted to receive electromagnetic radiation in a desired portion of the THz region, are electrically coupled to the modulation doped quantum well interface such that the received THz electromagnetic radiation increases the two dimensional electron gas (2D gas) temperature at the modulation doped quantum well interface with respect to the lattice. The resulting variation in 2D gas temperature produces a current resulting from thermionic emission over the modulation doped quantum well barrier. This current is proportional to the power of the received THz electromagnetic radiation. The changes in this current thus represent the energy fluctuations in the desired portion of the THz region.

The THz detection device of the present invention (and the current signal produced therefrom) can be used in many applications. For example, it can be used to detect a carrier wave in the THz region. In this configuration, the carrier wave can be modulated in accordance with a data stream in the range of 100's of GHz, and the current signal processed as part of a THz receiver. In another application, the current signal can be accumulated over nanosecond to millisecond time increments (due to the high speed of response of the 2D gas) as part of an imager of THz radiation. Moreover, the THz detection device of the present invention advantageously can be efficiently integrated with a broad range of optical and electronic devices, for example to provide an integrated THz detector together with associated optoelectronics and logic circuits.

Preferably, the THz detection device of the present invention (and possibly other optoelectronic devices and logic circuits that are fabricated integral thereto) are realized from the inversion quantum-well channel device structures as described in detail in U.S. Pat. No. 6,031,243; U.S. patent application Ser. No. 09/556,285, filed on Apr. 24, 2000; U.S.

patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; incorporated by reference above in their entireties. With these structures, a single fabrication sequence is used to make all the devices, including the THz detection device, electrical devices (e.g., transistors) and optoelectronic devices (e.g., laser/detector/modulator). In other words, a single set of n type and p type contacts, critical etches, dielectric depositions etc. are used to realize all of these devices simultaneously. The essential features of this device structure include 1) an n-type modulation doped interface and a p-type modulation doped quantum well interface, 2) a refractory metal gate/emitter contact, 3) self-aligned channel contacts formed by ion implantation, 4) n-type metal contacts to the n-type ion implants and the bottom n-type layer, and 5) p-type metal contacts to the p-type layers.

The state of the charge in the modulation doped quantum well channel is controlled by the bias applied between the gate terminal and an injector terminal electrically coupled to the quantum well channel. If a sufficient positive bias is applied between the gate terminal and the injector terminal, gate conduction injects charge into the channel. On the other hand, if a zero bias (or other bias condition that does not cause gate conduction) is applied between the gate terminal and the injector terminal, there is negligible gate conduction and the channel charge controls the absorption edge in the device. Similarly, channel charge may be removed from the device by a current source electrically coupled to the injector terminal. Optical devices are created from these structures by separating the metal gate into two sections which are connected electrically by the P+ layer along the top surface. The active device structure is formed between a bottom distributed bragg reflective (DBR) mirror and a top dielectric mirror, thereby forming a waveguide with an optical mode centered near the modulation doped quantum well channel.

A cross-section of the generic device structure is shown in FIG. 1. This shows the structure of a quantum-well-base bipolar transistor. The quantum-well-base bipolar transistor is interesting because of the way in which it combines the unipolar conduction of a typical Heterojunction FET (HFET) device and the bipolar conduction of a typical Heterojunction Bipolar Transistor (HBT). It is, in fact, a quantum-well-base bipolar transistor based upon modulation doping. The contacts to the modulation doped channel perform as source/drain contacts of a typical HFET with gate bias applied in the conventional way. The channel charge performs as the minority charge of a bipolar transistor. Then, as the charge flows into the channel it biases the internal barrier of the device to the flow of majority carriers from the emitter into the collector. Because of its combination of bipolar and FET principles the device is sometimes referred to as a Bipolar Inversion Channel Field Effect Transistor (BICFET). Advantageously, the thermionic emission in the quantum-well-base bipolar transistor occurs vertically in the epitaxial growth direction and the distances are short (on the order of 100 Å) so that cutoff frequencies above 1 THz can be obtained without the need for extremely short lithographic dimensions of the device.

The device includes, starting from a semi-insulating substrate 10, an n+ GaAs contact layer 12 (which is electrically connected to a subcollector terminal metal layer 13), an n-type AlGaAs layer 14, a p-type AlGaAs layer 16 (which is electrically connected to a collector terminal metal layer 17), an n-type modulation doped quantum well structure 18 (which is electrically connected to base terminal metal layer 19 via n-type ion implants 21), an undoped spacer layer 20, a p+-type charge sheet 22, a p-type barrier layer of AlGaAs 24, and a P+ contact layer 26 of GaAs (which is electrically connected to emitter terminal metal layer 27).

The responsivity of the device of FIG. 1 depends upon the change of the electron temperature of the 2D gas ($T_e$) with input power $P_{in}$ of the received THz radiation. This relationship can be understood by the following analysis. If an electron (or hole) is represented by its equation of motion in the presence of a perturbing electric field $E_0 e^{jwt}$, and solve for displacements of the electron $x_0 e^{jwt}$, then one can solve for the velocity, the current flow and the average power absorbed by the RF field. In the steady state, this is balanced by the heat lost to the lattice by the emission of polar optical phonons and from this energy balance we obtain the result $$\Delta T_e = T_e - T_l = \frac{q^2 E_o^2}{2C_{th}m} \frac{\tau_m \tau_e}{1+\omega^2 \tau_m^2} = \frac{q^2 \eta P_{in}}{2C_{th}m} \frac{\tau_m \tau_e}{1+\omega^2 \tau_m^2} \quad (1)$$

where m is the electron mass, $C_{th}$ is the specific heat of the electron (approximately equal to Boltzmanns constant, k), $T_e$ is the electron temperature, $T_l$ is the lattice temperature, $\tau_m$ is the momentum relation time, and $\tau_e$ is the energy relaxation time. The input power is related to the radiation field via $P_{in} = E_0^2/2\eta$, where $\eta$ is the intrinsic impedance of the material. An important parameter for sensitivity is $C_{th}$. Its inherently small value results in sizeable values of $T_e$ for small values of $P_{in}$. It is seen that, since the time constant $\tau_m$ is typically on the order of 0.1 picoseconds, the high frequency roll-off for the response of the electron gas is about 10 THz.

Figure 2:
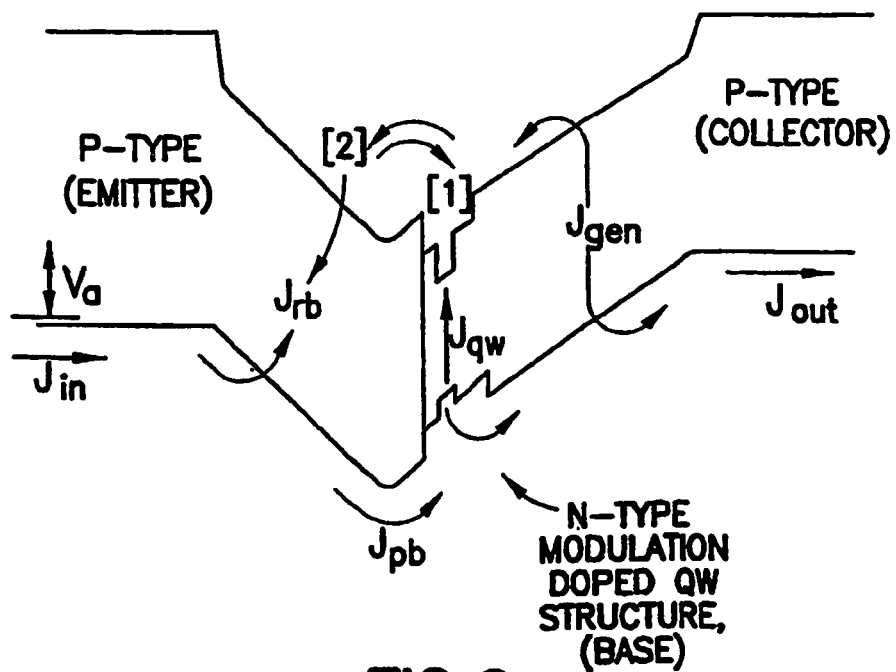
FIG. 2 is an energy band diagram illustrating the operation of the quantum-well base bipolar transistor device of FIG. 1 in response to THz radiation supplied to the quantum well base region of the device via one or more antenna elements coupled thereto.

To understand the thermionic behavior of the device of FIG. 1, consider the energy diagram in FIG. 2. The important current components are shown which include the recombination component $J_{rb}$ (flow of holes from the emitter), the thermionic emission current (labeled "[1]") flowing from the n-type modulation doped layer to the quantum well, the thermionic emission current (labeled "[2]") flowing from the quantum well to the n-type modulation doped layer, and the generation current $J_{gen}$ in the collector which adds electrons to the quantum well and also supplies the hole current flowing to the back junction. The current flow equation is indicated in the figure, in which the recombination is a small current equal to the difference between large emission currents into and out of the quantum well (for zero bias, $J_{rb}=0$ and the emission currents are just balanced). In the absence of radiation (with some nominal bias $V_a$), the lattice temperature $T_1$ and the electron temperature $T_e$ are equal and $J_{rb}$ represents the dark current in the device. Another significant component is $J_{pb}$, representing thermionic emission over the barrier. The changes in the current $J_{pb}$ represent the output of the detector. The equation that represents this balance of currents is $$J_{rbo}\left[\left(\frac{n_o}{n_o^*}\right)^{1/2} e^{\Delta V_b/2V_T} - 1\right] = \qquad (2)$$

$$qv_{th}n_o e^{-\varphi_2/kT_e} - qv_{th}\frac{N_c e^{(E'_{Fn}-E_c)/kT}}{1 + \frac{1}{4}e^{(E'_{Fn}-E_c)/kT}}e^{-\varphi_1/kT_l}$$

where the left hand side (LHS) is the recombination current flowing in the emitter as shown in FIG. 2. This is the continuity current written from the viewpoint of the modulation doping. The two terms on the right hand side (RHS) represent the thermionic emission components between the quantum well and the modulation doped layer and both of them contain T in the exponent of the exponential term. However, with the coupling of radiation into the quantum well, the temperature of the quantum well component becomes $T_e$ and the temperature of the component from the modulation doped layer to the quantum well remains at $T_L$. Therefore there is a net thermionic flow from the quantum well to the modulation doped layer. This leads to a decreasing value of $n_o$, which is the electron density in the quantum well. The change in $T_e$ will be small. We may expand this term and obtain the following:

$$J_{rbo}\left[\left(\frac{n_o}{n_o^*}\right)^{1/2} e^{\Delta V_b/2V_T} - 1\right] = qv_{th}n_o e^{-\varphi_2/kT_e} - \qquad (3)$$

$$qv_{th}\frac{N_c e^{(E'_{Fn}-E_c)/kT}}{1 + \frac{1}{4}e^{(E'_{Fn}-E_c)/kT}}e^{-\varphi_1/kT_l} + qv_{th}n_o e^{-\varphi_2/kT_e}\frac{\varphi_2}{kT_L}\frac{\Delta T_e}{T_L}$$

We see that the last term is a driving force, which is proportional to the change $\Delta T_e$. We also see from (1), that this change in $T_e$ is proportional to the input power of the received THz radiation. Therefore the additional term corresponds to RP where R is the responsivity in amps/watt for the basic mechanism of transferring electrons to the modulation doping. Thus the value of R is:

$$R = qv_{th}n_o e^{-\varphi_2/kT_e}\frac{\varphi_2}{kT_L}\frac{1}{T_L}\frac{q^2\eta}{2Cm}\frac{\tau_m\tau_e}{1+\omega^2\tau_m^2} \qquad (4)$$

The other equation that describes the current flow through the device is $$J_{rb} = J_{rbo}\left[\left(\frac{n_o}{n_o^*}\right)^{1/2} e^{\Delta V_b/2V_T} - 1\right] = J_{gen} \qquad (5)$$

which simply states that the net current flowing through the device during this process must remain constant since the effect of the THz radiation is simply to shift the charge internal to the device. The shifting of charge from the well to the sheet region causes no to decrease. From equation (5), since $J_{gen}$ is constant, $\Delta V_b$ will increase. The increase in $\Delta V_b$ will cause the current $J_{pb}$ in FIG. 2 to increase. It is this increase in current that represents the net output current of the device and is proportional to the input power of the received THz radiation. By rearranging (5) and calculating the current $\Delta J_{pb}$, we obtain $$\Delta J_{pb} = J_{pbco}\left\{\frac{J_{gen}}{J_{rbo}} - 1\right\}^2 \frac{n_o^*}{[(C_b+C_d)\Delta V_{bd} - C_d V_{CE}]^2}\frac{R}{qv}P_{in} = R_{eff}P_{in} \qquad (6)$$

The output current is an increase in the collector current that flows in response to the input power $P_{in}$ of the received THz radiation. Substituting typical numbers yields $R_{eff} \approx 0.05$ A/W. This number for THz radiation is quite reasonable by comparison to typical responsivities for long wavelength infra-red (LWIR) radiation.

An important point should be noted here. The dark current flowing in the system is $J_{gen}$ and this is the generation current across the energy gap of the AlGaAs. This is not the current thermally activated out of a well of extremely low energy. The thermal currents flowing in and out of the well are always in balance even in equilibrium and under bias, and as such they produce no noise. It is only the net dark current $J_{gen}$ that produces noise. This means that the cryogenic cooling will not be required to eliminate the effects of dark current noise. Thus, detection of THz radiation occurs at room temperature.

Note that the quantum-well base bipolar transistor device as described above may be used as a THz detector. In this configuration, antenna elements (which are adapted to receive electromagnetic radiation in a desired portion of the THz region) are electrically coupled (or integrally formed with) the base terminal electrodes such the that antenna elements are electrically connected to the modulation doped quantum well interface of the device. The current signal output from the collector is proportional to the input power $P_{in}$ of the received THz radiation.

Figure 3A:
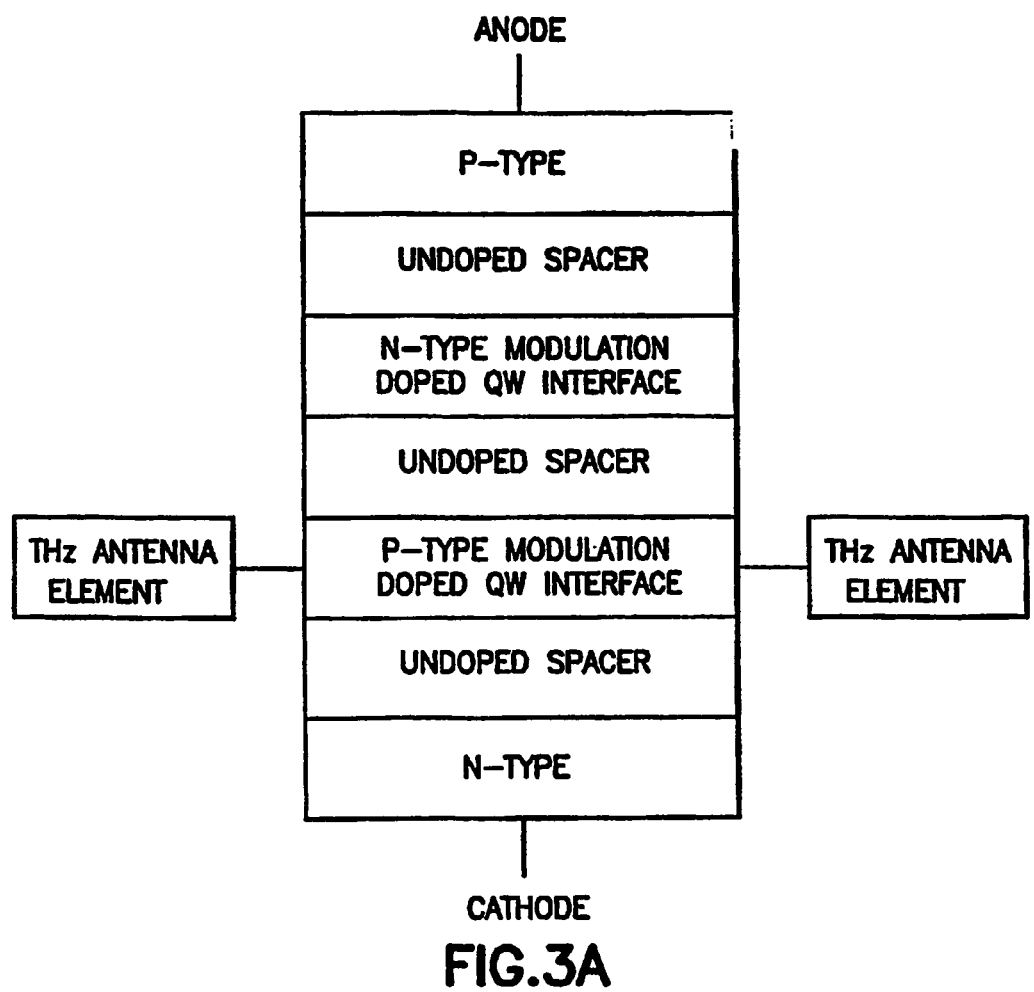
FIG. 3A is a schematic view showing an exemplary double quantum-well thyristor device with THz antenna elements coupled to a quantum well interface of the device.
Figure 3B:
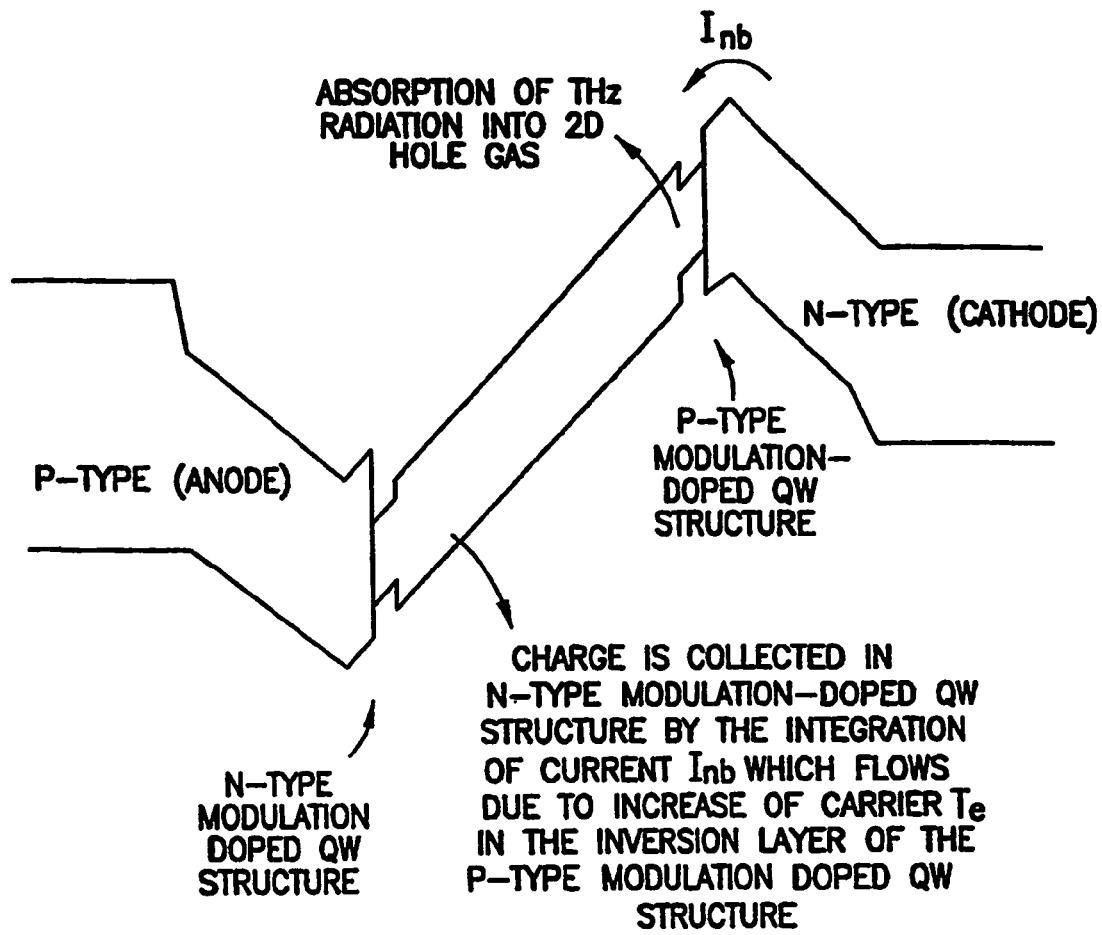
FIG. 3B is an energy band diagram illustrating the operation of the double quantum well thyristor device of FIG. 3A in response to THz radiation supplied to a quantum well interface of the device via antenna elements coupled thereto.

Alternatively, a heterojunction thyristor structure may be used as a THz detector. As shown in FIG. 3A, the heterojunction thyristor structure includes an n-type quantum-well-base bipolar transistor and p-type quantum-well-base bipolar transistor arranged vertically to share a common collector region. Antenna elements, which are adapted to receive electromagnetic radiation in a desired portion of the THz region, are electrically coupled (or integrally formed with) the p-channel injector electrodes of the heterojunction thyristor device such the that antenna elements are electrically connected to the p-type modulation doped quantum well interface of the device. As described above, absorbed radiation will empty the p-type quantum well, thus accumulating a charge in the p-type modulation doped layer and producing a forward bias $\Delta v_b$ on the p-type QW channel barrier, which results in a current flow $I_{nb}$ as shown in FIG. 3B. The current $I_{nb}$ flows over the p-type channel barrier to the n-type QW channel. This current causes charge $Q_n$ to accumulate in the n-type QW channel. The accumulated charge $Q_n$ represents the intensity of the received THz radiation. The operation of the heterojunction-thyristor-based THz detector is suitable for many applications, including data communication applications and imaging applications as described below in detail.

Figure 4:
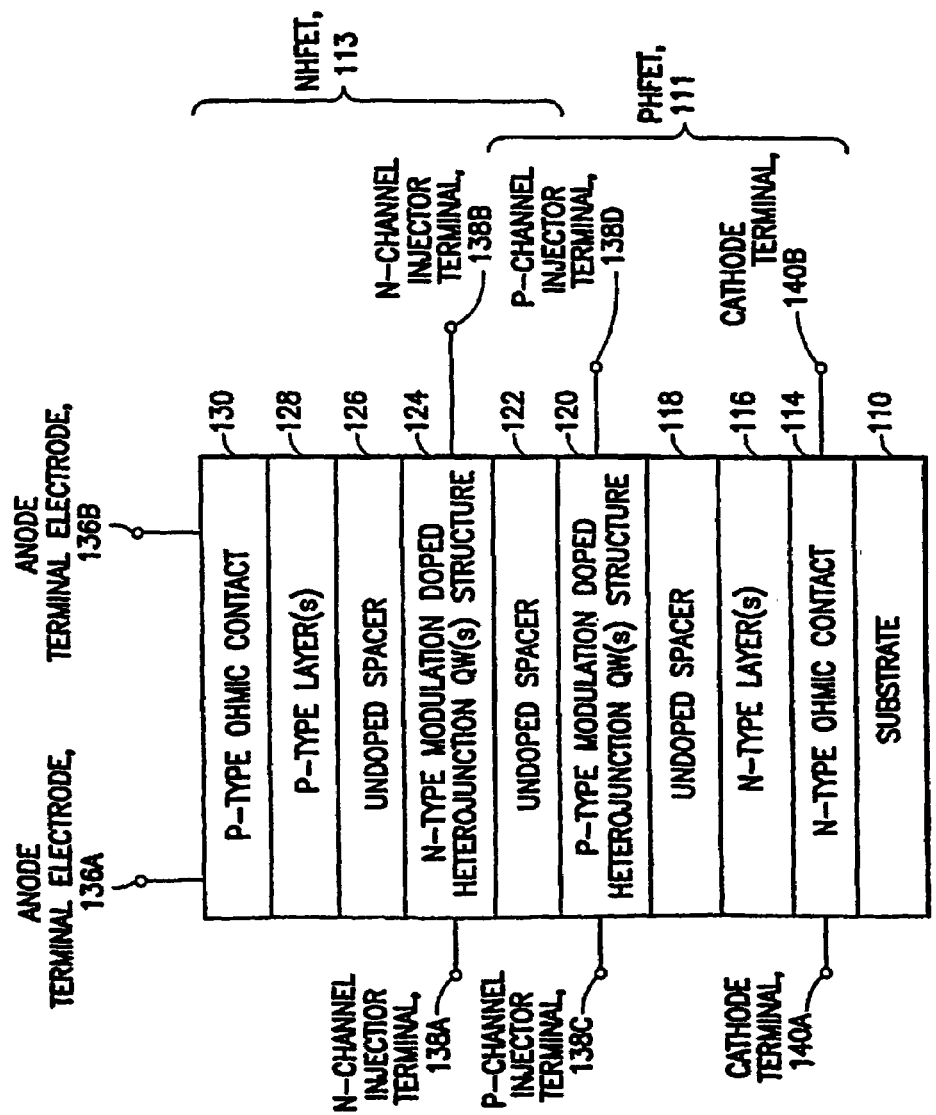
FIG. 4 is a schematic showing a layer structure from which the heterojunction thyristor devices and THz detection mechanisms of the present invention can be made.

The general structure of the heterojunction thyristor device is illustrated in FIG. 4. In addition, the general structure of FIG. 4 can be configured to operate as a wide range of electronic devices (e.g., field effect transistors, bipolar transistors) such that these devices can be integrated to form a monolithic optoelectronic integrated circuit as described herein. The structure includes an active device structure formed above the a substrate 110. The active device structure consists of two HFET devices. The first of these is a p-channel HFET (PHFET) 111 (comprising layers 114, 116, 118, 120 and 122) which has one or more p-type modulation doped QWs and is positioned with the gate terminal on the lower side and the collector terminal on the upper side. The second of these is an n-channel HFET (NHFET) 113 (comprising layers 122, 124, 126, 128, 130) which has one or more n-type modulation doped QWs and is positioned with the gate terminal on the top side and the collector terminal on the lower side which is the collector of the p-channel device. Therefore a non-inverted n-channel device is stacked upon an inverted p-channel device to form the active device structure.

The active device layer structure begins with n-type ohmic contact layer(s) 114 which enables the formation of ohmic contacts thereto. Deposited on layer 114 is one or more n-type layer(s) 116. In this configuration, layer 114 achieves low contact resistance and layer 116 defines the capacitance of the p-channel HFET 111 with respect to the p-type modulation doped QW heterostructure 120. Deposited on layer 116 is an undoped layer 118. Layers 114, 116 and 118 serve electrically as part of the gate of the p-channel HFET 111. Deposited on layer 118 is a p-type modulation doped QW structure 120 that defines one or more quantum wells (which may be formed from strained or unstrained heterojunction materials). Deposited on the p-type modulation doped QW structure 120 is an undoped spacer layer 122, which forms the collector of the p-channel HFET device 111. All of the layers grown thus far form the p-channel HFET device 111 with the gate ohmic contact on the bottom.

Undoped spacer layer 122 also forms the collector region of the n-channel HFET device 113. Deposited on layer 122 is a n-type modulation doped QW structure 124 that defines one or more quantum wells (which may be formed from strained or unstrained heterojunction materials). Deposited on the n-type modulation doped QW structure 124 is an undoped layer 126. Deposited on layer 126 is a p-type layer structure 128. Deposited on the p-type layer structure 128 is a p-type ohmic contact layer(s) 130 which enables the formation of ohmic contacts thereto. Layers 126, 128 and 130 serve electrically as part of the gate of the n-channel HFET 113. In this configuration, layer 130 achieves low contact resistance and layer 128a defines the capacitance of the n-channel HFET 113 with respect to the n-type modulation doped QW heterostructure 124.

Alternatively, the active device structure may be described as a pair of stacked quantum-well-base bipolar transistors formed above the substrate 110. The first of these is an p-type-quantum-well-base bipolar transistor (comprising layers 114, 116, 118, 120 and 122) which has one or more p-type modulation doped quantum wells and is positioned with the emitter terminal on the lower side and the collector terminal on the upper side. The second of these is an n-type-quantum-well-base bipolar transistor (comprising layers 122, 124, 126, 128, 130) which has one or more n-type modulation doped quantum wells and is positioned with the emitter terminal on the top side and the collector terminal on the lower side which is the collector of the p-type quantum-well-base bipolar transistor. Therefore, an n-channel device is stacked upon a p-channel device to form the active device structure. In this configuration, the gate terminal of the p-channel HFET device 111 corresponds to the emitter terminal of the p-type-quantum-well-base bipolar transistor, the p-type QW structure 120 corresponds to the base region of the p-type-quantum-well-base bipolar transistor, spacer layer 122 corresponds to the collector region of both the p-type quantum-well-base bipolar transistor and the n-type quantum-well-base bipolar transistor, the n-type QW structure 124 corresponds to the base region of the n-type-quantum-well-base bipolar transistor, and the gate terminal of the n-channel HFET device 113 corresponds to the emitter electrode of the n-type-quantum-well-base bipolar transistor.

To form a resonant cavity device where light is input into and emitted from the device laterally (i.e., from a direction normal to the cross section of FIG. 4), a bottom DBR mirror (not shown) is formed between the substrate 110 and the active device structure described above. In addition, a diffraction grating (for example, as described in detail in U.S. Pat. No. 6,031,243) and top dielectric mirror are formed over the active device structure described above. For vertical cavity lasing devices, the diffraction grating performs the function of diffracting light produced by the vertical cavity into light propagating laterally in a waveguide which has the top dielectric mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity. Alternatively, light may enter and exit the resonant vertical cavity through an optical aperture (not shown) in the top surface of the device. In this case, the diffraction grating is omitted, the top mirror defines a cavity for the vertical emission and absorption of light, and the device operates as a vertical cavity surface emitting laser/detector. The distance between the top mirror and bottom DBR mirror preferably represents an integral number of ½ wavelengths at the designated wavelength. This distance is controlled by adjusting the thickness of one or more of the layers therebetween to enable this condition.

To form a thyristor structure, one or more anode terminal electrodes (two shown as 136A and 136B) are operably coupled to the p-type ohmic contact layer 130, one or more n-channel injector terminal electrodes (two shown as 138A, 138B) are operably coupled to the n-type QW structure 124, one or more p-channel injector terminal electrodes (two shown as 138C, 138D) are operably coupled to the p-type QW structure 120, and one or more collector terminal electrodes (two shown as 140A, 140B) are operably coupled to the n-type ohmic contact layer 114.

The multilayer structure described above may be realized with a material system based on group III-V materials (such as a GaAs/AlGaAs). Alternatively, strained silicon heterostructures employing silicon-germanium (SiGe) layers may be used to realize the multilayer structures described herein. FIG. 5 illustrates an exemplary epitaxial growth structure utilizing group III-V materials for realizing the multilayer structure of FIG. 4 and the optoelectrical/electrical/optical devices formed from this structure in accordance with the present invention. The structure of FIG. 5 can be made, for example, using known molecular beam epitaxy (MBE) techniques. As shown, an active device structure consisting of two HFET devices is deposited on a semi-insulating GaAs substrate 1149. The first of these is the p-channel HFET (PHFET) 111, which has one or more p-type modulation doped quantum wells and is positioned with the gate terminal on the bottom and the collector terminal above. The second of these is an n-channel HFET (NHFET) 113, which has one or more n-type modulation doped quantum wells and is positioned with the gate terminal on top and the collector terminal below. The collector region of the NHFET device 113 also functions as the collector region of the PHFET device 111. However, the collector terminal of the NHFET device 113 is a p-type contact to p-type quantum well(s) disposed below (above) the collector region, while the collector terminal of the PHFET device 111 is a n-type contact to n-type quantum well(s) disposed above the collector region. Therefore a non-inverted n-channel device is stacked upon an inverted p-channel device to form the active device structure.

The active-device layer structure begins with layer 1153 of N+ type GaAs that enables the formation of ohmic contacts thereto (for example, when contacting to the cathode terminal of a heterojunction thyristor device, the gate terminal of an inverted p-channel HFET device, the sub-collector terminal of an n-channel HFET device, or the emitter terminal of a p-type quantum-well-base bipolar device). Layer 1153 has a typical thickness of 500-3000 Å and a typical n-type doping of $3.5 \times 10^{18}$ cm$^3$. The N+ doped GaAs layer 1153 corresponds to the ohmic contact layer 114 of FIG. 4. Deposited on layer 1153 is layer 1154 of n-type $Al_{x1}Ga_{1-x1}As$ with a typical thickness of 500-3000 Å and a typical doping of $1 \times 10^{17}$ cm$^{-3}$. The parameter x1 is in the range between 15% and 80%, and preferably in the range of 30%-40% for layer 1154. This layer serves as part of the PHFET gate. Next are 4 layers (1155a, 1155b, 1155c, and 1155d) of $Al_{x2}Ga_{1-x2}As$. These 4 layers (collectively, 1155) have a total thickness about 380-500 Å and where x2 is about 15%. The first layer 1155a is about 60-80 Å thick and is doped N+ type in the form of delta doping. The second layer 1155b is about 200-300 Å thick and is undoped. The third layer 1155c is about 80 Å thick and is doped P+ type in the form of delta doping. And the fourth layer 1155d is about 20-30 Å thick and is undoped to form a spacer layer. This layer forms the lower separate confinement heterostructure (SCH) layer for the laser, amplifier and modulator devices. The n-type AlGaAs layer 1154 and n-type AlGaAs layer 1155a correspond to the n-type layer(s) 116 of FIG. 4, and the undoped AlGaAs layer 1155b corresponds to the undoped spacer layer 118 of FIG. 4.

The next layers define the quantum well(s) that form the inversion channel(s) during operation of the PHFET 111. For a strained quantum well, this consists of a spacer layer 1156 of undoped GaAs that is about 10-25 Å thick and then combinations of a quantum well layer 1157 that is about 40-80 Å thick and a barrier layer 1158 of undoped GaAs. The quantum well layer 1157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 μm, the nitrogen content will be 0%; for a natural emission frequency of 1.3 μm, the nitrogen content will be approximately 2%; and for a natural emission frequency of 1.51 μm, the nitrogen content will be approximately 4-5%. The well barrier combination will typically be repeated (for example, three times as shown), however single quantum well structures may also be used. Unstrained quantum wells are also possible. Following the last barrier of undoped GaAs is a layer 1159 of undoped $Al_{x2}Ga_{1-x2}$ which forms the collector of the PHFET device 111 and is about 0.5 μm in thickness. All of the layers grown thus far form the PHFET device 111 with the gate contact on the bottom. The layers between the P+ AlGaAs layer 1155c and the last undoped GaAs barrier layer 1158 correspond to the p-type modulation doped heterojunction QW structure 120 of FIG. 4. Undoped AlGaAs layer 1159 corresponds to the undoped spacer layer 122 of FIG. 4.

Layer 1159 also forms the collector region of the NHFET device 113. Deposited on layer 1159 are two layers (collectively 1160) of undoped GaAs of about 200-250 Å total thickness, which form the barrier of the first n-type quantum well. Layer 1160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 1160 includes a single layer 1160a of about 150 Å and a repeating barrier layer 1160b of about 100 Å. The next layer 1161 is the quantum well of $In_{0.2}Ga_{0.8}As$, which is undoped and about 40-80 Å in thickness. It is noted that the n-type quantum well layer 1161 need not be of the same formulation as the p-type quantum well layer 1157. The barrier layer 1160b of 100 Å and quantum well layer 1161 may be repeated, e.g., three times. Then there is a barrier layer 1162 of about 10-30 Å of undoped GaAs which accommodates a growth interruption and a change of growth temperature. Next there are four layers (collectively 1163) of $Al_{x2}Ga_{1-x2}As$ of about 300-500 Å total thickness. These four layers (1163) include a spacer layer 1163a of undoped $Al_{x2}Ga_{1-x2}As$ that is about 20-30 Å thick, a modulation doped layer 1163b of N+ type doping of $Al_{x2}Ga_{1-x2}As$ (with doping about $3.5 \times 10^{18}$ cm$^{-3}$) that is about 80 Å thick, a capacitor spacing layer 1163c of undoped $Al_{x2}Ga_{1-x2}As$ that is about 200-300 Å thick, and a P+ type delta doped layer 1163d of $Al_{x2}Ga_{1-x2}As$ (with doping about $3.5 \times 10^{18}$ cm$^{-3}$) that is about 60-80 Å to form the top plate of the capacitor. The doping species for layer 1163d is preferably carbon (C) to ensure diffusive stability. In contrast to layer 1163b which is always depleted, layer 1163d should never be totally depleted in operation. Layers 1163d and 1163b form the two plates of a parallel plate capacitor which forms the field-effect input to all active devices. For the optoelectronic device operation, layer 1163 is the upper SCH region. Layer 1163 must be thin to enable very high frequency operation. The layers between the undoped GaAs barrier layer 1160a and the N+ AlGaAs layer 1163b correspond to the n-type modulation doped heterojunction QW structure 124 of FIG. 4. Undoped AlGaAs layer 1163c corresponds to the undoped spacer layer 126 of FIG. 4.

One or more layers (collectively 1164) of p-type $Al_{x2}Ga_{1-x2}As$ are deposited next to form part of the upper waveguide cladding for the laser, amplifier and modulator devices. Layer 1164 has a typical thickness of 500-1500 Å. Layer 1164 may have a first thin sublayer 1164a of, e.g., 10-20 Å thickness and having a P+ typical doping of $10^{19}$ cm$^{-3}$. A second sublayer 1164b has a P doping of $1 \times 10^{17}$-$5 \times 10^{17}$ cm$^{-3}$ and a typical thickness of 700 Å. The parameter x1 of layer 1164 is preferably about 70%. The p-type layers 1163b, 1164A, 1164B correspond to the p-type layer(s) 128 of FIG. 4.

Deposited next is an ohmic contact layer 1165 (which may comprise a single layer of GaAs or a combination of GaAs (1165a) and InGaAs (1165b) as shown), which is about 50-100 Å thick and doped to a very high level of P+ type doping (about $1 \times 10^{20}$ cm$^{-3}$) to enable the best possible ohmic contact.

Alternatively, the active device structure may be described as a pair of stacked quantum-well-base bipolar transistors formed on the substrate 1149. The first of these is a p-type quantum-well-base bipolar transistor (comprising layers 1153 through 1159) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 1159 through 1165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the gate terminal of the PHFET 111 corresponds to the emitter terminal of the p-type quantum-well-base bipolar transistor, the p-type QW structure (layers 1155c though 1158) corresponds to the base region of the p-type quantum-well-base bipolar transistor, spacer layer 1159 corresponds to the collector region of both the p-type quantum-well-base bipolar transistor and the n-type quantum-well-base bipolar transistor, the n-type QW structure (layers 1160a through 1163b) corresponds to the base region of the n-type quantum-well-base bipolar transistor, and the gate terminal of the NHFET 113 corresponds to the emitter electrode of the n-type quantum-well-base bipolar transistor.

To form a resonant cavity device where light is input into and emitted from the device laterally (i.e., from a direction normal to the cross section of FIG. 4), a bottom DBR mirror (not shown) is formed between the substrate 110 and the active device structure described above. In addition, a diffraction grating (for example, as described in detail in U.S. Pat. No. 6,031,243) and top dielectric mirror are formed over the active device structure described above. For vertical cavity lasing devices, the diffraction grating performs the function of diffracting light produced by the vertical cavity into light propagating laterally in a waveguide which has the top mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity. Alternatively, light may enter and exit the resonant vertical cavity vertically through an optical aperture in the top surface of the device. In this case, the diffraction grating is omitted, the top mirror defines a cavity for the vertical emission and absorption of light, and the device operates as a vertical cavity surface emitting laser/detector. The distance between the top mirror and bottom DBR mirror preferably represents an integral number of ½ wavelengths at the designated wavelength. Preferably, the thickness of layer 1164 and/or layer 1159 is adjusted to enable this condition.

The structures of FIGS. 4 and 5 may also be used to realize various optoelectronic devices, including heterojunction thyristor devices and an array of transistor devices (including n-channel HFET devices, p-channel HFET devices, n-type quantum-well-base bipolar transistors and p-type quantum-well-base bipolar transistors), and other optoelectronic and waveguide devices. Such devices are described in detail in U.S. patent application Ser. No. 10/323,388, filed on Dec. 19, 2002; and U.S. patent application Ser. No. 10/340,942, filed on Jan. 13, 2003; incorporated by reference above in their entireties.

Figure 6A:
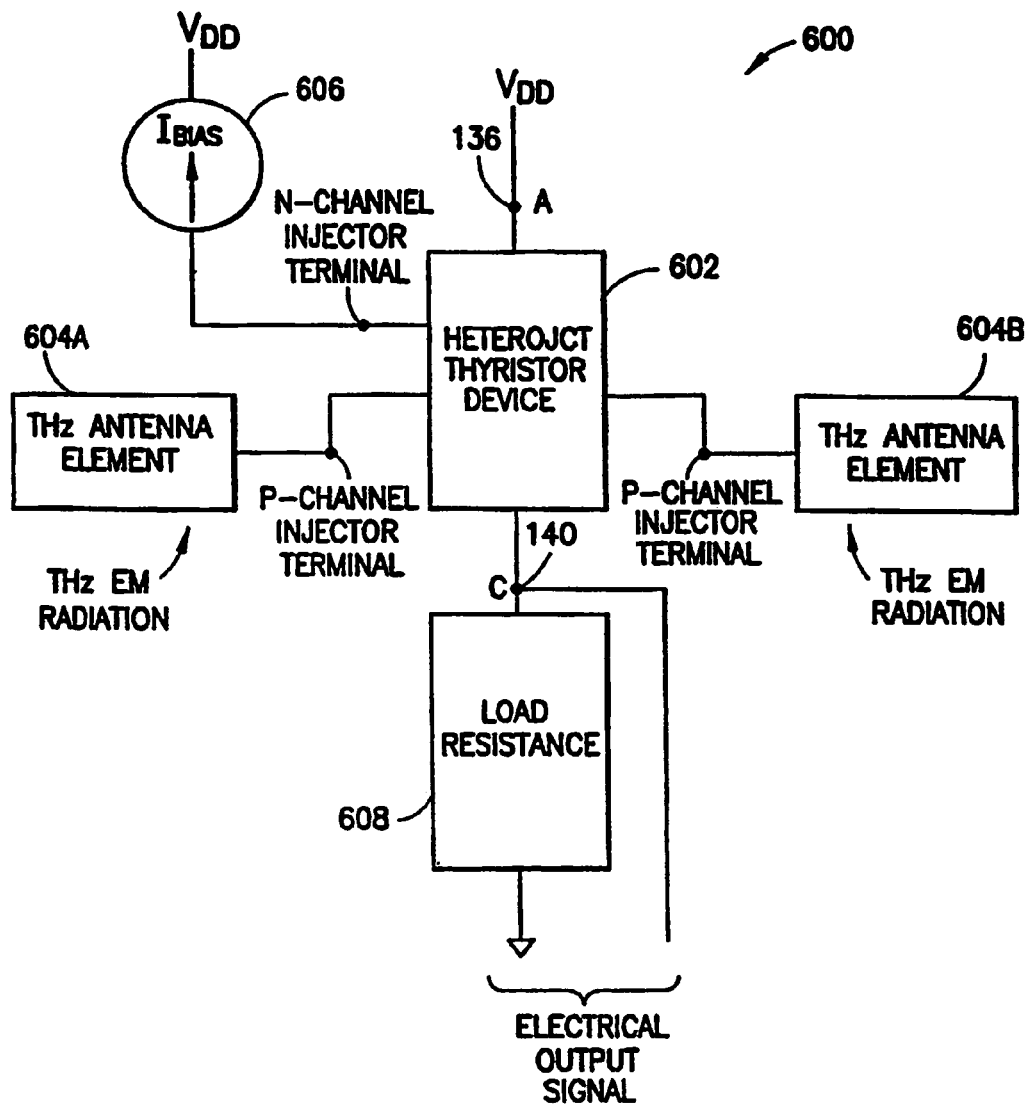
FIG. 6A is a functional block diagram illustrating a heterojunction-thyristor-based THz detector adapted for data communication applications in accordance with the present invention.

FIGS. 6A, 6B, 6C1 and 6C2 illustrate heterojunction-thyristor-based THz detectors adapted for data communication applications. As shown in FIG. 6A, the THz detector 600 includes a heterojunction thyristor device 602 (the details of which are set forth above) and a pair of planar bowtie antenna elements 604A, 604B that are electrically coupled to opposite sides of the p-channel quantum well of the heterojunction thyristor device 602 via the p-channel injector terminals of the device 602. The bowtie antenna elements 604A, 604B are sized to receive a desired frequency band within the THz region (100 GHz-10,000 GHz).

More specifically, the aspect ratio, which is the length (e.g., vertical dimension in FIGS. 6C1 and 6C2) over the width (e.g., horizontal dimension in FIGS. 6C1 and 6C2) and taper angle of the bowtie antenna elements 604A, 604B are set such that the antenna elements receive a desired frequency band within the THz region (100 GHz-10,000 GHz). The antenna elements 604A, 604B may be other types of planar integrated antenna elements, such as planar slot type antenna elements, planar log-periodic type antenna elements, or other planar antenna elements. A slot-type antenna element includes an elongated slot (e.g., hollow waveguide channel) that is adapted to receive the desired THz radiation. A log-periodic-type antenna element includes a series of teeth and notches that are adapted to receive the desired THz radiation. Details of examples of exemplary antenna elements are set forth in Rebeiz, "Millimeter-Wave and Terahertz Integrated Circuit Antennas," Proceedings of IEEE, Vol. 80. No. 11, November 1992, pp. 1748-1770, and Huo et al. "Planar Log-Period Antennas on extended Hemispherical Silicon Lenses for Millimeter/Submillimeter Wave Detection and Applications," International Journal of Infrared and Millimeter Waves, Vol. 23, No. 6, June 2002, pp. 819-839, herein incorporated by reference in their entireties.

The thyristor device 602 is adapted to be switched from a non-conducting/OFF state (where the current I flowing from the anode terminal 136 to the cathode terminal 140 is substantially zero) to a conducting/ON state (where current I is substantially greater than zero) when: i) the anode terminal 136 is forward biased (e.g. biased positively) with respect to the cathode terminal 140; and ii) absorption of energy in the QW channel(s) of p-type modulation doped heterojunction QW structure 120 (which occurs in response to the received THz radiation via the bowtie antenna elements 604A, 604B electrically coupled thereto) produces a charge in the p-type modulation doped QW structure 120 that is greater than the critical switching charge $Q_{CR}$, which is that charge that reduces the forward breakdown voltage such that no off state bias point exists. The critical switching charge $Q_{CR}$ is unique to the geometries and doping levels of the device, and any bias current supplied to the injector terminal(s) of the device.

The thyristor device switches from the conducting/ON state to a non-conducting/OFF state when the current I through the device falls below the hold current $I_H$ of the device for a sufficient period of time such that the charge in the n-type modulation doped QW structure 124 and/or the charge in the p-type modulation doped QW structure 120 decreases below the holding charge $Q_H$. The holding charge $Q_H$ is the critical value of the channel charge which will sustain holding action.

In this application, the THz energy is transmitted in bursts according to an On/Off Keying (OOK) format. In this format, a digital one ("1") is provided by a series of N THz pulses (for example, a series of 100 THz pulse) in a unit of time, and a digital zero ("0") is provided by the absence of the series of THz pulses in the unit of time. The thyristor device 602 is adapted to switch into the ON/conducting state in response to the detection of a digital one ("1") and switch into the OFF/non-conducting state in response to the detection of a digital zero ("0"). Preferably, this is accomplished by electrically coupling the anode terminal 136 of the thyristor device 602 to a positive voltage potential $V_{DD}$, electrically coupling a current source 606 to the n-type modulation doped QW channel of thyristor device 602, and electrically coupling a load resistor 608 between the cathode terminal 140 of thyristor device 602 and ground potential as shown. The current source 606 provides a bias current $I_{BIAS}$ that drains electrons from the n-type modulation doped QW channel of thyristor device 602. The bias current $I_{BIAS}$ is set such that:

i) the accumulated charge in the n-type modulation doped QW channel of thyristor device 602 that results from the reception of a digital "1", N (e.g., 100) THz pulses, in a predetermined time interval exceeds the critical switching charge $Q_{CR}$ of the device 602; and ii) the accumulated charge in the n-type modulation doped QW channel of thyristor device 602 that results from the reception of a digital "0" in a predetermined time interval falls below the holding charge $Q_H$ of the device 602.

The load resistance 608 is set such that the current I through device 602 in the ON/conducting state is greater than the hold current $I_H$. In this manner, the thyristor device 602 produces a differential electrical signal (labeled "electrical output signal") between its cathode terminal 140 and ground potential that corresponds to the detection of a digital "1" and digital "0", respectively. More specifically, the differential electrical signal includes a large ΔV signal (e.g., pulse) that corresponds to the detection of a digital "1", and a zero ΔV signal (or near ΔV signal) that corresponds to the detection of a digital "0".

The thyristor device 602 may also be realized as an optoelectronic device as described herein in detail. In this configuration, the load resistance 608 is set such that the current I through device 602 in the ON/conducting state is greater than the threshold lasing current $I_{TH}$ of the device 602. In this manner, the thyristor device 602 produces an optical digital signal in the active area of the device that corresponds to the detection of a digital "1" and digital "0", respectively. More specifically, the optical digital signal includes an optical pulse that corresponds to the detection of a digital "1", and the absence of an optical pulse that corresponds to the detection of a digital "0". Preferably, this optical digital signal is output laterally from the active area of the device to a passive optical waveguide aligned therewith for subsequent processing. Alternatively, this optical digital signal may be output vertically from the active area of the device to a fiber coupler (or other optical device) aligned therewith for subsequent processing.

Note that the response time of the digital signal detection is determined by the response time of the thyristor switching. An integration time of 10 picoseconds, and turn-on/turn-off times of 5 picoseconds enable data frequencies on the order of 500 GHz to be detected. At a THz frequency of 5 THz, this implies that approximately 100 cycles of radiation are contained in a digital "1" pulse. The ultimate response speed is limited by the internal transit time of the device (assuming the THz power is sufficient to integrate the charge for switching in one transit time) and not the thermionic response time of the heterointerface. Thus, it is clear, that the thyristor device is suitable for realizing high frequency digital impulse radar and/or high frequency radio systems.

FIGS. 6B and 6C1 illustrate a schematic view of an exemplary realization of the thyristor device 602 of FIG. 6A. The structure of layers 110 through 130 as described above with respect to FIG. 4 is provided. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. The refractory anode terminals 136A and 136B (which collectively form the anode terminal 136 of the device) are deposited and defined preferably via liftoff of metal layer 610.

Then an ion implant 170 of n+-type is performed using a photomask that is aligned to the alignments marks, to thereby form contacts to the n-type QW inversion channel(s). During this operation, mesas are formed by etching down to (or near) undoped spacer layer 126. The resulting mesas are subject to the N+ ion implants 170.

Then an ion implant 171 of p+-type is performed using a photomask that is aligned to the alignments marks, to thereby form contacts to the p-type QW inversion channel(s). During this operation, mesas are formed by etching preferably down to the undoped spacer layer 122. The resulting mesas are then subject to P+ ion implants 171.

Connection to the cathode terminals 140A and 140B of the device is made by etching down to the n-type ohmic contact layer 114.

Next the device is subjected to a rapid thermal anneal (RTA) of the order of 900° C. or greater to activate all implants. Then the device is isolated from other devices by an etch down to the semi-insulating substrate 110.

The final step in the fabrication is the deposition (preferably via lift off) of metal contacts. These contacts come in three forms. One is the metal layer 612 (preferably comprising an n-type Au alloy metal such as AuGe/Ni/Au) deposited on the mesas at the n-type contact layer 114 to form the cathode terminal electrodes 140A, 140B of the device. The second is the metal layer 614 (preferably comprising a p-type Au metal alloy such as AuZn/Cr/Au) deposited on the P+ type implant 171 to form the p-channel injector terminal electrodes 138C, 138D. The third is the metal layer 616 (preferably comprising an n-type Au alloy metal such as AuGe/Ni/Au) deposited on the N+ type implants 170 to form the n-channel injector terminal electrodes 138A, 138B.

Note that the planar bowtie antenna elements 604A and 604B and the p-channel injector terminals 138C, 138D are integrally formed from the same metal layer 614 as best shown in the cross-section of FIG. 6C1. Also note that the metal layer 614 is formed above the metal layer 612 that makes up the cathode terminal electrodes 140A, 140B. A dielectric layer 618 is disposed between the two metal layers 612/614 to provide for isolation of these two layers.

Note that optoelectronic devices (e.g., lasers, optical detectors, optical modulators, optical amplifiers) include n-type ion implants (not shown) into the top contact layer 130. An optical aperture is defined by the separation between these implants. These implants create a p-n junction in the layers between the n-type quantum well(s) and the surface, and the aperture between the implants defines the region in which the current may flow, and therefore the optically active region of the device. The current cannot flow into the n-type implanted regions because of the barrier to current injection. In addition, to form a device suitable for in-plane optical injection into a resonant vertical cavity and/or in-plane optical emission from the resonant vertical cavity, a diffraction grating (not shown), as described in more detail in U.S. Pat. No. 6,021,243, incorporated by reference above in its entirety) and top dielectric mirror is deposited on this structure as described above. To form a device suitable for vertical optical injection into (and/or optical emission from) a resonant vertical cavity, the diffraction grating is omitted. The top dielectric mirror is preferably created by the deposition of one or more dielectric layer pairs, which typically comprise $SiO_2$ and a high refractive index material such as GaAs, Si, or GaN, respectively.

Also note that the operations described above to realize a thyristor device (and other optoelectronic devices) from the multilayer structure of FIG. 4 are readily adaptable to realize such devices from the multilayer structure of FIG. 5.

FIG. 6C2 illustrates a schematic plan view of an alternate realization of the thyristor device 602 of FIG. 6A. This device is similar in many aspects to the device of FIGS. 6B and 6C1 as described above; however, it utilizes interdigitization of the n-type implants 170 (and associated metal layer 616) with respect to the p-type implants 171 (and associated metal layer 614) on both sides of the device as shown. Note that n-type implants 170 and the p-type implants 171 are shallow (preferably on the order of 1000-2000 Å) to achieve high frequency performance. Such interdigitization minimizes the access resistance to the p-type quantum well channel, while slightly increasing the access resistance of the n-type, quantum well channel. Such low access resistance to the p-type quantum well channel provides improved coupling efficiency between the antenna elements and the p-type quantum well channel.

Figure 7A:
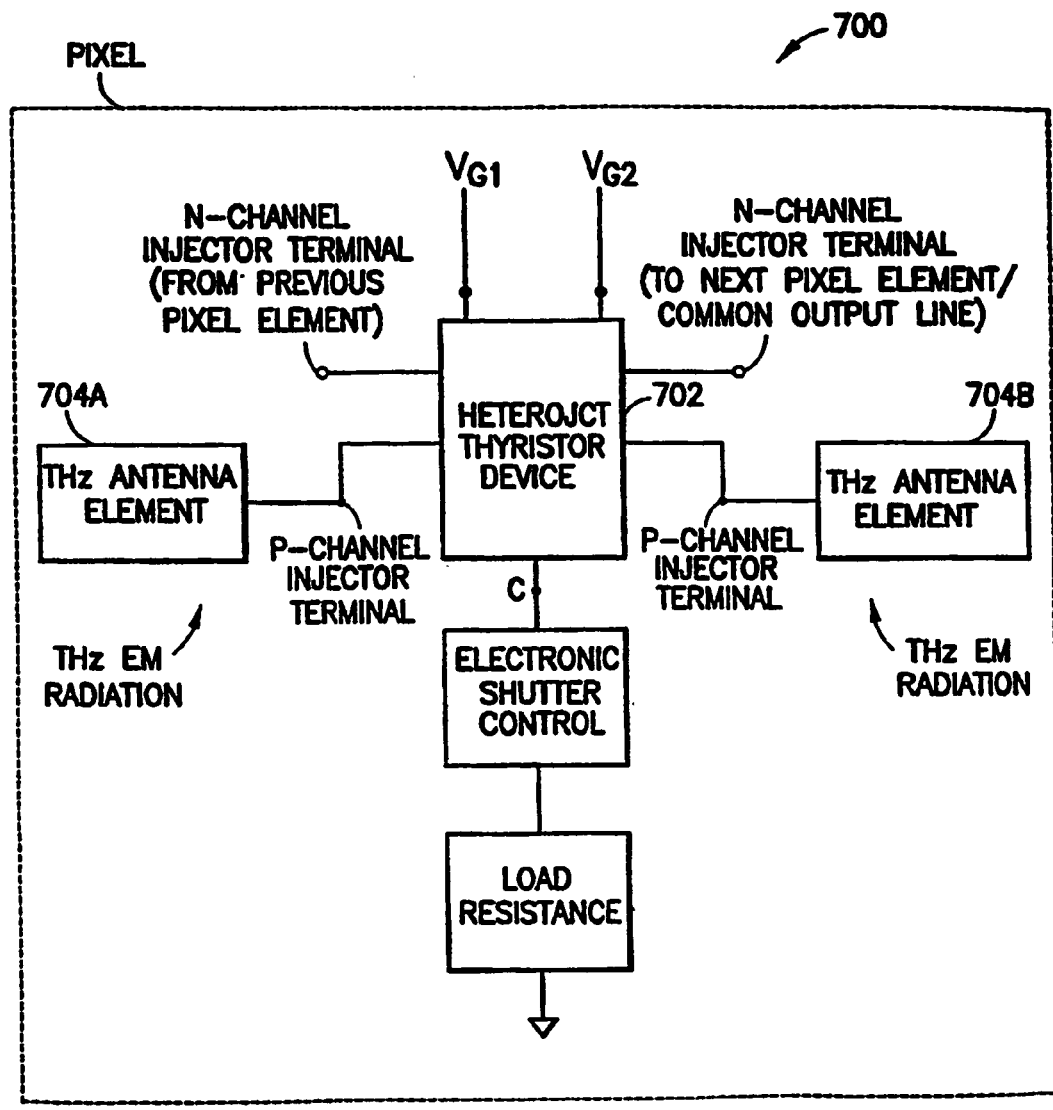
FIG. 7A is a functional block diagram illustrating a heterojunction-thyristor-based THz detector adapted for imaging applications in accordance with the present invention.
Figure 7B:
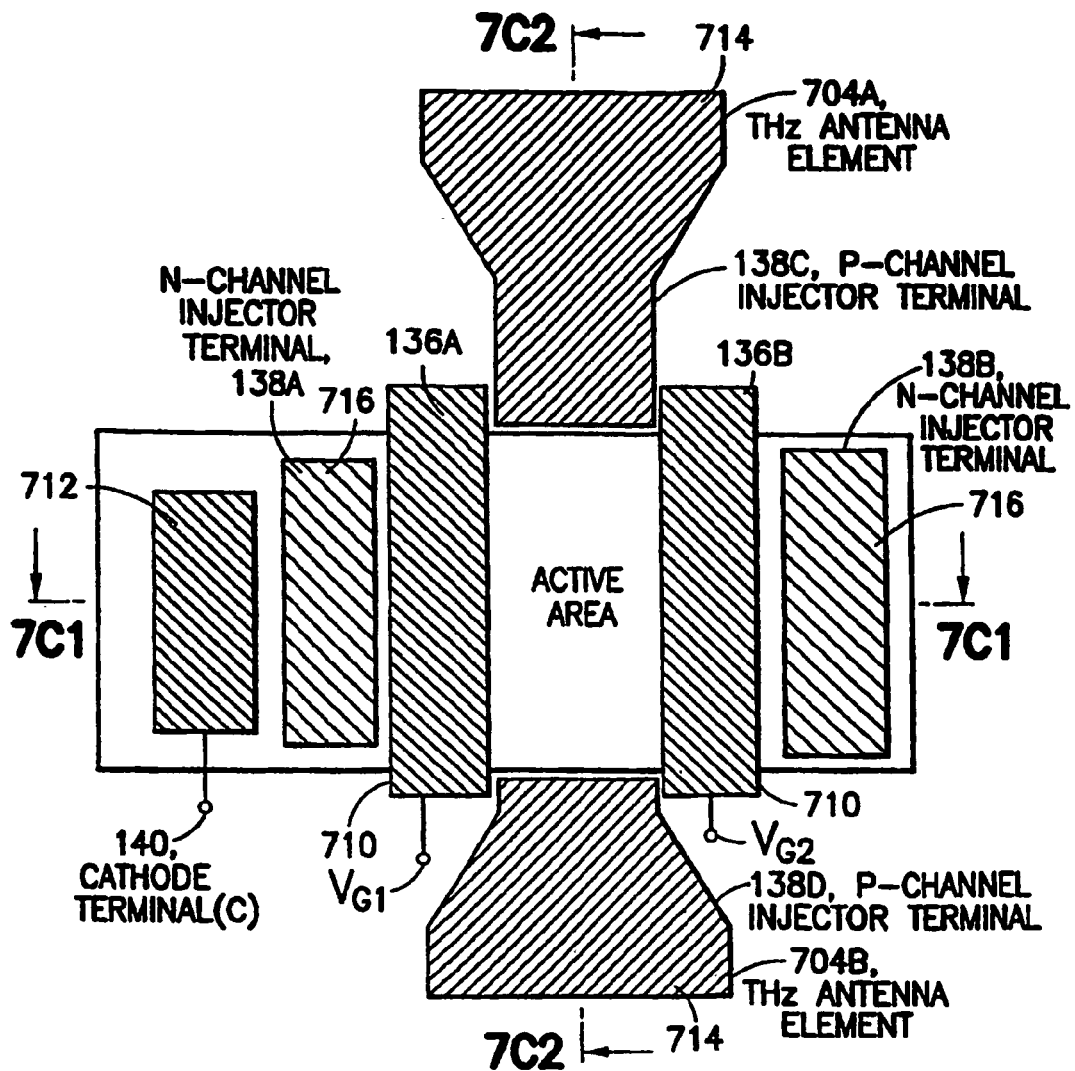
FIG. 7B is a schematic plan views showing an exemplary realization of the thyristor device and antenna elements of FIG. 7A.

FIGS. 7A, 7B, 7C1 and 7C2 illustrate thyristor-based THz detectors adapted for imaging applications. In this application, the thyristor-based THz detector forms a pixel element for use in imaging array. As shown in FIG. 7A, the pixel element 700 includes a heterojunction thyristor device 702 (the details of which are set forth above) and a pair of planar bowtie antenna elements 704A, 704B that are electrically coupled to opposite sides of the p-channel quantum well interface of the heterojunction thyristor device 702 via the p-channel injector terminals 138C, 138D of the device 702. The bowtie antenna elements 704A, 704B are sized to receive a desired frequency band within the THz region (100 GHz-10,000 GHz). More specifically, the aspect ratio, which is the length (e.g., vertical dimension in FIG. 7B) over the width (e.g., horizontal dimension in FIG. 7B) and taper angle of the bowtie antenna elements 704A, 704B are set such that the antenna elements receive a desired frequency band within the THz region (100 GHz-10,000 GHz). The antenna elements 704A, 704B may be other types of planar integrated antenna elements, such as planar slot type antenna elements, planar log-periodic type antenna elements, or other planar antenna elements as described above.

The thyristor device 702 is adapted to perform an imaging cycle including a Pixel Setup Mode, a Signal Integration Mode, and a Signal Transfer Mode as described below in detail.

In the Pixel Setup Mode, the n-type QW channel of the device 702 is emptied of free electrons, thereby forcing the n-type QW channel into a state of deep depletion. Preferably, this is accomplished by maintaining the $V_{G1}$ electrode at a positive voltage (e.g., on the order of three volts) and providing a positive voltage pulse (e.g., on the order of three volts) to the n-channel injector terminal 138A to thereby remove free electrons from n-type QW channel of the device 702. This puts the n-type QW channel into a non-steady state of depletion (devoid of electrons), which will eventually be changes to a steady state of electrons by thermal processes during the signal integration mode. During the initialization operations of the Pixel Setup Mode, preferably the $V_{G2}$ electrode is maintained in an open-circuit configuration and the electronic shutter control maintains the cathode terminal in an open-circuit configuration. Alternatively, this sequence of operations may be executed by the n-channel injector terminal 138B on the output side (i.e., using the corresponding n-channel injector terminal 138B).

In the Signal Integration Mode, the THz radiation received by the bowtie antenna elements 704A, 704B is supplied to the p-type modulation doped QW interface of device 702 via p-channel injector electrodes 138C, 138D. As described above, absorbed radiation will empty the p-type quantum well, thus accumulating a charge in the p-type modulation doped layer and producing a forward bias $\Delta v_b$ on the p-type QW channel barrier, which results in a current flow $I_{nb}$ as shown in FIG. 3B. The current $I_{nb}$ flows over the p-type channel barrier to the n-type modulation doped QW interface of device 702. This current causes charge $Q_n$ to accumulate in the n-type modulation doped QW interface. This accumulated charge $Q_n$ represents the intensity of the received THz radiation over the time period (sometimes referred to as "integration time period") of the Signal Integration Mode. Preferably, this is accomplished by maintaining the voltage levels at the $V_{G1}$ electrode at a positive voltage (e.g., on the order of three volts) and maintaining the $V_{G2}$ electrode at a low voltage (e.g., on the order of zero volts). In addition, the n-channel injector terminals 136A, 136B on the input side and output side, respectively are floating (i.e., in a high impedance state), and the electronic shutter control electrically the cathode terminal of the device to the load resistance of the device to enable normal operation of the thyristor device.

In the Signal Transfer Mode, the charge $Q_n$ accumulated in the n-type modulation doped QW interface during the previous Signal Integration Mode is read out from the pixel element. Preferably, this is accomplished by the electronic shutter control maintaining the cathode terminal in an open-circuit configuration, and applying a multiphase clock scheme to the $V_{G1}$ electrode on the input side of the device and $V_{G2}$ electrode on the output side of the device, respectively, which clocks the charge out of the pixel element via the n-channel injector terminal 136B on the output side of the device. In CCD-type pixel applications, the charge clocked out from the adjacent pixel is clocked into the pixel element via the n-channel injector terminal 136A on the input side of the device. A wide variety of multiphase clocking schemes well known in the CCD art, such as 4-phase, 3-phase, psuedo 2-phase, true two phase and virtual phase clocking schemes, may be employed. Such schemes are described in detail in "Kodak CCD Primer, #KCP-001, CHARGE-COUPLED DEVICE (CCD) IMAGE SENSORS," downloaded from www.kodak.com/US/en/digital/pdf/ccdPrimerPart2.pdf on Apr. 24, 2003, herein incorporated by reference in its entirety. In an exemplary two-phase clocking scheme, a voltage level on the order of 0 volts may be applied to the $V_{G1}$ electrode on the input side of the respective pixel element and a voltage level on the order of 1.5 volts may be applied the $V_{G2}$ electrode on the output side of the respective pixel element, to thereby transfer the stored charge out of the pixel element via the n-channel injector terminal 136B on the output side of the device. Upon completion of the Signal Transfer Mode, the imaging cycle is complete and the operation continues to the Pixel Setup Mode of the next imaging cycle.

Figure 8A:
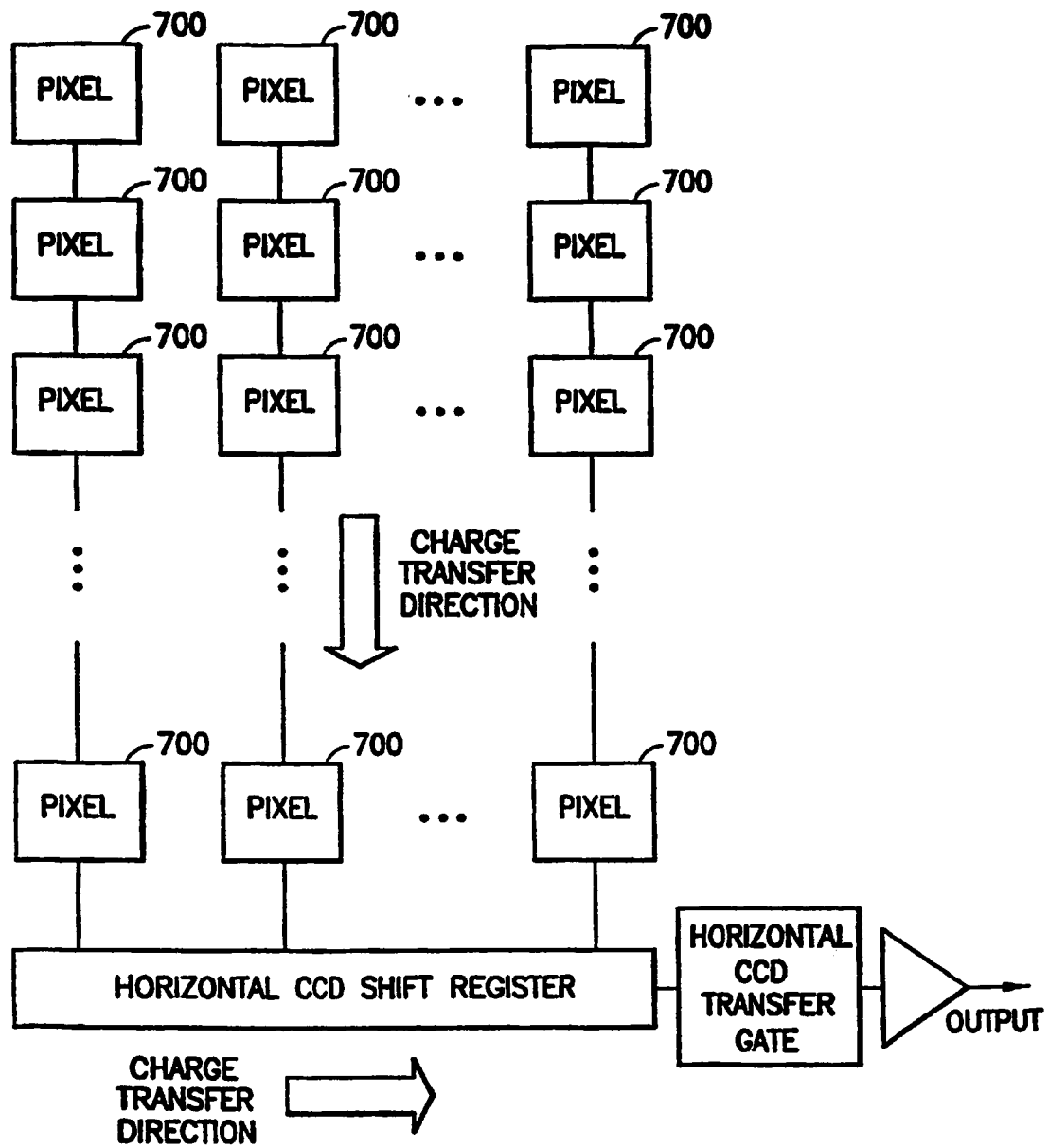
FIG. 8A is a functional block diagram illustrating the system architecture of a full-frame-type imaging array.

In a full-frame-type imaging array as shown in FIG. 8A, the pixel elements are arranged in columns of CCD elements. The last pixel/CCD in each column is coupled to a horizontal CCD shift register. In this architecture, the charge stored in the pixel/CCD elements is transferred vertically to the horizontal CCD shift register for output therefrom.

Figure 8B:
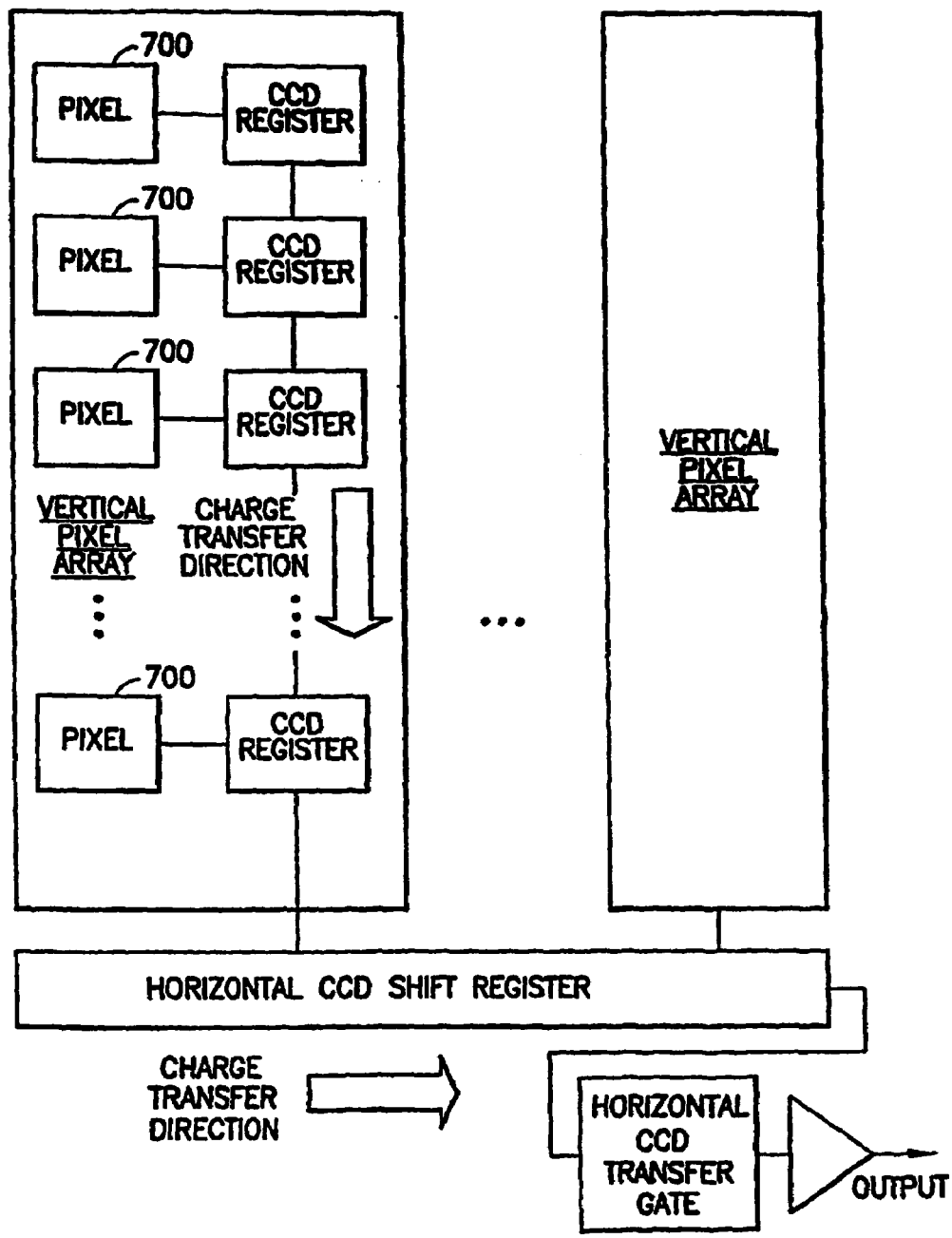
FIG. 8B is a functional block diagram illustrating the system architecture of an interline-type imaging array.

In an interline-type imaging array as shown in FIG. 8B, the pixel elements are arranged in columns. The pixels of a given column are electrically coupled to CCD registers to form a vertical pixel array. The last CCD register of each vertical pixel array is coupled to a horizontal CCD shift register. In this architecture, the charge stored in the pixel elements of a given vertical pixel array is transferred to the corresponding CCD registers. The charge stored in the CCD registered is then transferred to the horizontal CCD shift register for output therefrom.

Figure 8C:
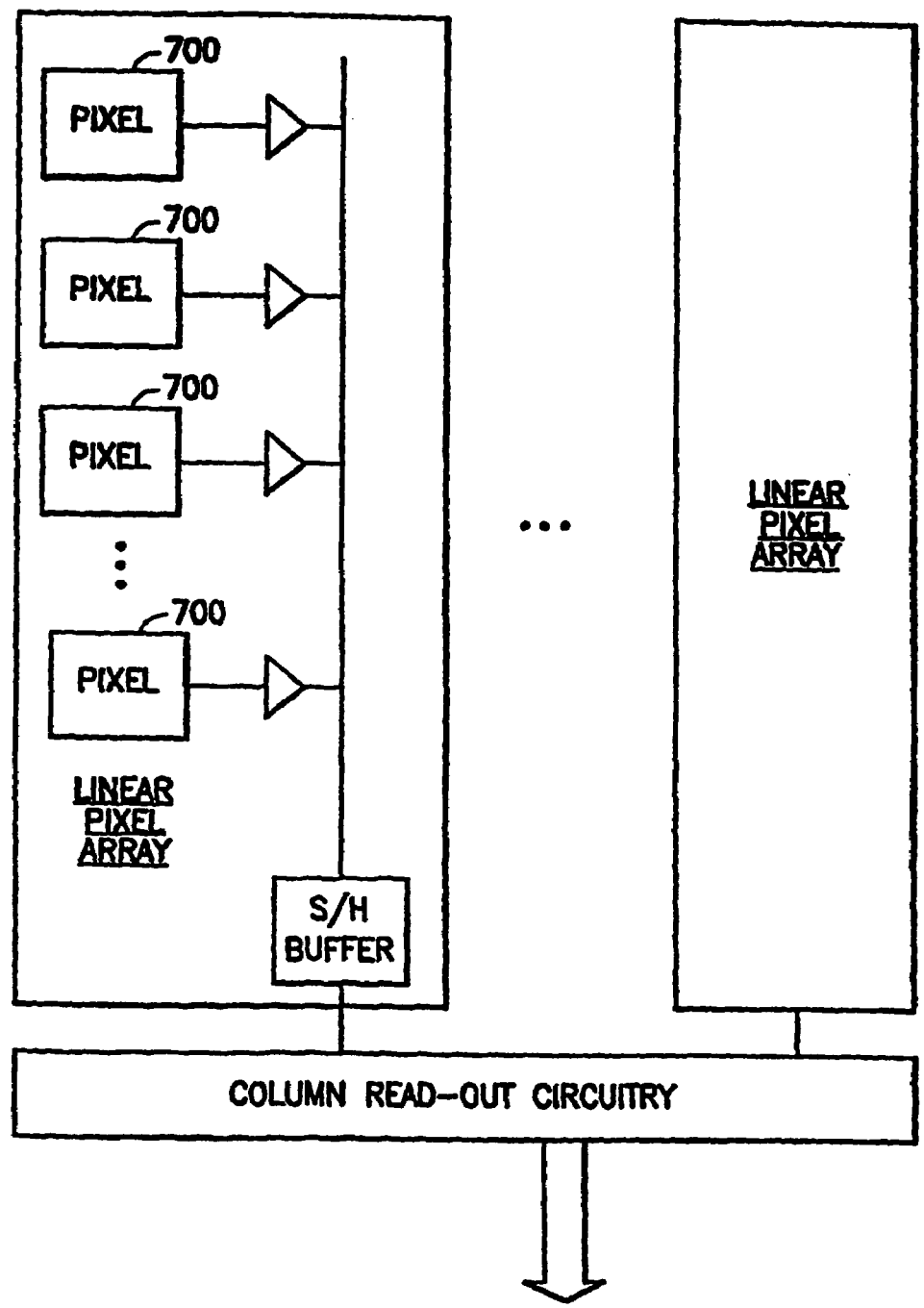
FIG. 8C is a functional block diagram illustrating the system architecture of an active-pixel-type imaging array.

In an active-pixel-type imaging array as shown in FIG. 8C, the pixel elements are arranged in linear pixel arrays. Each pixel of a given linear pixel array is electrically coupled to an output amplifier. The output amplifiers of a given linear pixel array are electrically coupled to a common output line. In this architecture, the charge stored in the pixel elements of a given linear pixel array are selectively output (one at a time) to the corresponding output amplifier for supply to S/H buffer and readout circuitry via the common output line as shown.

Note that the CCD shift registers of FIGS. 8A and 8B can be realized with heterojunction thyristor devices that are similar to the thyristor-based pixel elements of the full-frame-type imaging array as described herein, yet such thyristor-based pixel elements do not include THZ antenna elements coupled thereto and perform the signal transfer mode operations as described above to transfer charge from element to element.

FIGS. 7B, 7C1 and 7C2 illustrate a schematic view of an exemplary realization of the thyristor device 702 of FIG. 7A. The structure of layers 110 through 130 as described above with respect to FIG. 4 is provided. To connect to the anode of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. The refractory anode terminals 136A and 136B are deposited and defined preferably via liftoff of metal layer 710.

Then an ion implant 170 of n+-type is performed using a photomask that is aligned to the alignments marks, to thereby form contacts to the n-type QW inversion channel(s). During this operation, mesas are formed by etching down to (or near) the undoped spacer layer 126. The resulting mesas are subject to the N+ ion implants 170 as shown in the cross-section of FIG. 7C1. Note that the n=-type implants 170 are utilized to form a barrier implant between a first portion of the n-type quantum well channel on the input side of the device and a second portion of the n-type quantum well channel on the output side of the device. During the Signal Integration Mode of the pixel element as described above, charge is accumulated in the first portion of the n-type quantum well channel on the input side of the device. The accumulated charge is then cocked out of this region during the Signal Transfer Mode of the pixel element as described above.

Then an ion implant 171 of p+-type is performed using a photomask that is aligned to the alignments marks, to thereby form contacts to the p-type QW inversion channel(s). During this operation, mesas are formed by etching preferably down to the undoped spacer layer 122. The resulting mesas are then subject to P+ ion implants 171 as show in the cross-section of FIG. 7C2.

Connection to the cathode terminal 140 of the device is made by etching down to the n-type ohmic contact layer 114.

Next the device is subjected to a rapid thermal anneal (RTA) of the order of 900° C. or greater to activate all implants. Then the device is isolated from other devices by an etch down to the semi-insulating substrate 110.

The final step in the fabrication is the deposition (preferably via lift off) of metal contacts. These contacts come in three forms. One is the metal layer 712 (preferably comprising an n-type Au alloy metal such as AuGe/Ni/Au) deposited on the mesas at the n-type contact layer 114 to form the cathode terminal electrode 140 of the device. The second is the metal layer 714 (preferably comprising an p-type Au metal alloy such as AuZn/Cr/Au) deposited on the P+ type implant 171 to form the p-channel injector terminal electrodes 138C, 138D of the device. The third is the metal layer 716 (preferably comprising an n-type Au alloy metal such as AuGe/Ni/Au) deposited on the N+ type implants 170 to form the n-channel injector terminal electrodes 138A, 138B of the device.

Note that the bowtie antenna elements 604A and 604B and the p-channel injector terminals 138C, 138D are integrally formed from the same metal layer 714 as best shown in the cross-section of FIG. 6C2.

In addition, note that the operations described above to realize a thyristor device (and other optoelectronic devices) from the multilayer structure of FIG. 4 are readily adaptable to realize such devices from the multilayer structure of FIG. 5. Also note that dielectric lens elements may be formed over the planar antenna element(s) that form a given pixel element to improve the performance of such antenna elements as is well known in the antenna arts.

It is also contemplated that that multiple thyristor-based signal processing elements of the imaging array may share a common antenna element. For example, a row of thyristor-based signal processing elements may share a common antenna element with angled metal feeds (e.g., a bow tie shape) that connect to the p-type QW channels of the multiple thyristors that form the row of the imaging array.

Also note that the THz detection mechanisms described above may be monolithically integrated with transistor logic (preferably HFET complementary logic) and transistor-based analog signal processing circuitry which provide signal processing and control functions. The device structures to realize such logic and signal processing circuitry is described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; incorporated by reference above in their entireties.

There have been described and illustrated herein several embodiments of a THz detection mechanism and device based thereon. While particular embodiments of the invention have been described, it is not intended that the invention be limited thereto, as it is intended that the invention be as broad in scope as the art will allow and that the specification be read likewise. Thus, while particular materials, fabrication processes, circuit elements, and circuit architectures have been disclosed, it will be understood the others can be used as well. In addition, while particular device structures have been disclosed, it will be appreciated that others can be used as well. It will therefore be appreciated by those skilled in the art that yet other modifications could be made to the provided invention without deviating from its spirit and scope as claimed.

What is claimed is:

1. An electronic device comprising:
a p-type modulation doped quantum well interface and an n-type modulation doped quantum well interface that are formed over a substrate and spaced apart from one another; and
at least one antenna element which is adapted to receive electromagnetic radiation in a desired portion of a THz region between 100 GHz and 10,000 GHz, said antenna element electrically coupled to said p-type modulation doped quantum well interface.

2. An electronic device according to claim 1, wherein:
THz electromagnetic radiation received by said antenna element is supplied to said p-type modulation doped quantum well interface and increases electron temperature of a two-dimensional electron gas at said p-type modulation doped quantum well interface thereby producing a current resulting from thermionic emission over a potential barrier provided by said p-type modulation doped quantum well interface, wherein said current results in accumulation of charge in said n-type modulation doped quantum well interface.

3. An electronic device according to claim 2, wherein:
said current is proportional to power of the received THz electromagnetic radiation.

4. An electronic device according to claim 1, wherein:
said p-type modulation doped quantum well interface and said n-type modulation doped quantum well interface are spaced apart from one another in a vertical dimension.

5. An electronic device according to claim 1, wherein:
said electromagnetic radiation comprises a THz carrier wave modulated in accordance with a data stream.

6. An electronic device according to claim 1, wherein:
charge is accumulated in said n-type modulation doped quantum well interface over an integration time period for subsequent readout therefrom.

7. An electronic device according to claim 4, wherein:
said n-type modulation doped quantum well interface is disposed above said p-type modulation doped quantum well interface.

8. An electronic device according to claim 7, further comprising:
an undoped spacer layer disposed between said p-type modulation doped quantum well interface and said n-type modulation doped quantum well interface.

9. An electronic device according to claim 8, further comprising:
p-type ions implants in electrical contact with said p-type modulation doped quantum well interface; and
n-type ions implants in electrical contact with said n-type modulation doped quantum well interface.

10. An electronic device according to claim 9, further comprising:
first channel injector terminals formed from a metal layer deposited on said p-type ion implants; and
second channel injector terminals formed from a metal layer deposited on said p-type ion implants.

11. An electronic device according to claim 10, further comprising:
an anode and cathode formed such that said p-type modulation doped quantum well interface and said n-type modulation doped quantum well interface are disposed between said anode and said cathode;
an anode terminal electrically coupled to said anode; and
a cathode terminal electrically coupled to said cathode to thereby integrally form a thyristor device on said substrate.

12. An electronic device according to claim 11, further comprising:
a current source, electrically coupled to said n-type modulation doped quantum well interface, providing a bias current that draws charge from said n-type modulation doped quantum well interface.

13. An electronic device according to claim 11, wherein:
said THz electromagnetic radiation comprises bursts of THz energy transmitted according to an On/Off Keying wherein a first digital logic value is provided by a series of N THz pulses in a unit of time and a second digital logic value is provided by absence of said series of N THz pulses in said unit of time.

14. An electronic device according to claim 13, wherein:
said thyristor device is adapted to switch into an ON/conducting state in response to the detection of THz electromagnetic radiation that represents said first digital logic value and to switch into an OFF/non-conducting state in response to detection of THz electromagnetic radiation that represents said second digital logic value.

15. An electronic device according to claim 14, further comprising:
a current source, electrically coupled to said n-type modulation doped quantum well interface, providing a bias current that draws charge from said n-type modulation doped quantum well interface, wherein said bias current is set such that:
i) accumulated charge in said n-type modulation doped quantum well interface that results from the reception of THz electromagnetic radiation that represents said first digital logic value in a predetermined time interval exceeds a critical switching charge of said thyristor device, and
ii) accumulated charge in said n-type modulation doped quantum well interface that results from the reception of THz electromagnetic radiation that represents said second digital logic value in a predetermined time interval falls below a holding charge of said thyristor device.

16. An electronic device according to claim 14, further comprising:
load resistance, operably coupled to said thyristor device, that provides a current I through said thyristor device when operating in said ON/conducting state, said current I greater than a characteristic hold current of said thyristor device.

17. An electronic device according to claim 14, wherein:
said thyristor device produces a differential electrical signal between its cathode terminal and ground potential that corresponds to the detection of THz radiation representing said first and second digital logic values, respectively.

18. An electronic device according to claim 14, wherein:
said load resistance provides a current I through said thyristor device when operating in said ON/conducting state that is greater than the threshold lasing current of said thyristor device.

19. An electronic device according to claim 18, wherein:
said thyristor device produces an optical digital signal in an active area of said thyristor device that corresponds to the detection of THz radiation representing said first and second digital logic values, respectively.

20. An electronic device according to claim 11, wherein: said thyristor device and at least one antenna element are adapted to perform a plurality of successive imaging cycles, wherein during each imaging cycle
i) initially said n-type modulation doped quantum well interface is emptied of charge,
ii) over an integration time period, charge is accumulated in said n-type modulation doped quantum well interface in response to received THz radiation, and
iii) subsequent to said integration time period, accumulated charge stored in said n-type modulation doped quantum well interface is output therefrom.

21. An electronic device according to claim 20, further comprising:
a plurality of pixel elements that each include said thyristor device and said at least one antenna element.

22. An electronic device according to claim 21, wherein: said plurality of pixel elements are part of a full-frame-type imaging array.

23. An electronic device according to claim 21, wherein: said plurality of pixel elements are part of an interline-type imaging array.

24. An electronic device according to claim 21, wherein: said plurality of pixel elements are part of an active-pixel-type imaging array.

25. An electronic device comprising:
a bipolar-type transistor comprising an emitter terminal, collector terminal, and at least one base terminal coupled to a modulation doped quantum well interface; and
at least one antenna element which is adapted to receive electromagnetic radiation in a desired portion of a THz region between 100 GHz and 10,000 GHz, said antenna element electrically coupled to said modulation doped quantum well interface via said at least one base terminal.

26. An electronic device according to claim 25, wherein: THz electromagnetic radiation received by said antenna element is supplied to said modulation doped quantum well interface and increases the electron temperature of a two-dimensional electron gas at said modulation doped quantum well interface thereby producing a current resulting from thermionic emission over a potential barrier provided by said modulation doped quantum well interface, wherein said current is output via the collector terminal of said bipolar-type transistor.

27. An electronic device according to claim 25, wherein: said current is proportional to power of the received THz electromagnetic radiation.

* * * * *